United States Patent
Kamata et al.

(10) Patent No.: US 8,237,145 B2
(45) Date of Patent: Aug. 7, 2012

(54) NONVOLATILE MEMORY DEVICE WITH RECORDING LAYER HAVING TWO PORTIONS OF DIFFERENT NITROGEN AMOUNTS

(75) Inventors: Chikayoshi Kamata, Kanagawa-ken (JP); Takayuki Tsukamoto, Kanagawa-ken (JP); Kohichi Kubo, Kanagawa-ken (JP); Shinya Aoki, Kanagawa-ken (JP); Takahiro Hirai, Kanagawa-ken (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 12/858,975

(22) Filed: Aug. 18, 2010

(65) Prior Publication Data

US 2011/0024713 A1 Feb. 3, 2011

Related U.S. Application Data

(63) Continuation of application No. PCT/JP2008/052636, filed on Feb. 18, 2008.

(51) Int. Cl.
*H01L 29/04* (2006.01)
*H01L 23/58* (2006.01)

(52) U.S. Cl. ......... 257/3; 257/2; 257/4; 257/5; 257/920; 438/95; 977/712; 977/734

(58) Field of Classification Search .................. 257/2–5, 257/920; 438/95; 977/712, 734
See application file for complete search history.

(56) References Cited

U.S. PATENT DOCUMENTS

| 2004/0201929 | A1* | 10/2004 | Hashimoto et al. ......... 360/324.1 |
| 2005/0233247 | A1* | 10/2005 | Hosoda et al. ........... 430/270.12 |
| 2006/0291370 | A1* | 12/2006 | Nakai et al. ................... 369/288 |

FOREIGN PATENT DOCUMENTS

| JP | 2005-32855 | 2/2005 |
| JP | 2006-156886 | 6/2006 |
| JP | 2007-35683 | 2/2007 |
| JP | 2007-235142 | 9/2007 |

* cited by examiner

*Primary Examiner* — Thanh V Pham
(74) *Attorney, Agent, or Firm* — Oblon, Spivak, McClelland, Maier & Neustadt, L.L.P.

(57) ABSTRACT

According to one embodiment, a nonvolatile memory device includes a stacked body including a first layer, a second layer and a recording layer. The recording layer is provided between the first layer and the second layer. The recording layer is capable of reversibly changing between a first state and a second state having a resistance higher than a resistance in the first state by a current supplied via the first layer and the second layer. The recording layer includes a first portion and a second portion provided in a plane of a major surface of the recording layer. The second portion has a nitrogen amount higher than a nitrogen amount in the first portion.

12 Claims, 18 Drawing Sheets

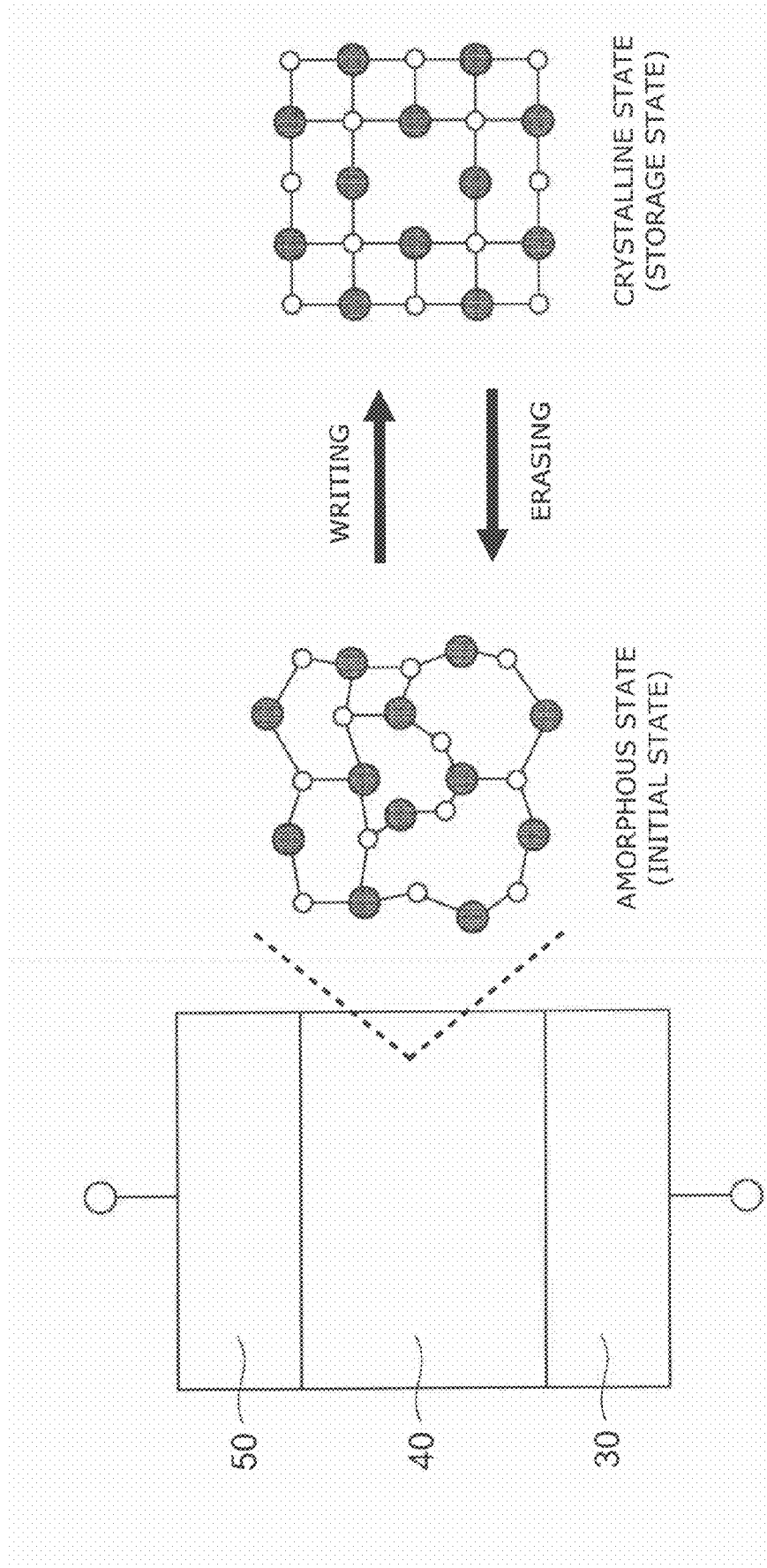

NONVOLATILE MEMORY DEVICE WITH RECORDING LAYER HAVING TWO PORTIONS OF DIFFERENT NITROGEN AMOUNTS

CROSS-REFERENCE TO RELATED APPLICATIONS

This is a continuation application of International Application PCT/JP2008/052636, filed on Feb. 18, 2008; the entire contents of which are incorporated herein by reference.

FIELD

Embodiments described herein relate generally to a nonvolatile memory device and a method for manufacturing the same.

BACKGROUND

The demand for small-sized and large-capacity nonvolatile memory devices (memory) rapidly increases these days under a circumstance in which small-sized portable devices are becoming widespread toward the realization of a ubiquitous society. In particular, NAND flash memory and small-sized HDD (hard disk drive) have made rapid progress in recording density and form a big market.

However, the NAND flash memory and the small-sized HDD are considered to reach the limit of recording density in the future.

The NAND flash memory may reach the limit of miniaturization due to short channel effects because the memory unit uses a transistor. The "short channel effects" are phenomena that occur due to a short distance between the source portion and the drain portion caused by the miniaturization of the device, specifically such as an increased leak current between the source and the drain. Furthermore, there is an increase in manufacturing cost due to the reduction of the minimum line width.

The small-sized HDD may reach the limit of tracking accuracy (the accuracy of adjusting a head to the correct position of a track on the HDD).

Accordingly, developing new technology that breaks the limit of recording density is desirable.

As such new technology, a phase-change nonvolatile memory device (phase-change memory) (PCRAM: phase-change random access memory) is investigated. The phase-change nonvolatile memory device is a nonvolatile memory device using the property that a semiconductor film (phase-change film) changes between a crystal state and an amorphous state by applying an electric field pulse to the phase-change film. By reversibly changing the phase-change film between a high resistance state (amorphous state, ON) and a low resistance state (crystal state, OFF), information is stored so that the information can be rewritten and may not be erased even if the power supply is turned off. Nonvolatile properties are obtained because both the high resistance state and the low resistance state of the phase-change film are stable. The phase-change nonvolatile memory device does not have the problems described above which may occur in the NAND flash memory or the small-sized HDD, and seems to be superior to the above two devices in high speed properties and miniaturization capability.

Here, a relatively large current flows in the phase-change nonvolatile memory device during operation, in particular at the time of erasing (reset). Therefore, it is required that the operating current be reduced.

As conventional technology in regard to this, there is a semiconductor integrated circuit device in which an alloy film (GST film) of germanium (Ge), antimony (Sb), and tellurium (Te) is used as a memory element and an ion of nitrogen, oxygen, or carbon is doped. For example, a region implanted with high concentration oxygen ions exhibits almost insulating properties and a pathway of a current for rewriting and signal transmission is limited to a low concentration ion implantation region (JP-A 2006-156886 (Kokai)).

BRIEF DESCRIPTION OF THE DRAWINGS

FIG. 3A to FIG. 3C are conceptual views illustrating the operation of the nonvolatile memory device according to the first embodiment;

DETAILED DESCRIPTION OF THE INVENTION

Figure 1:
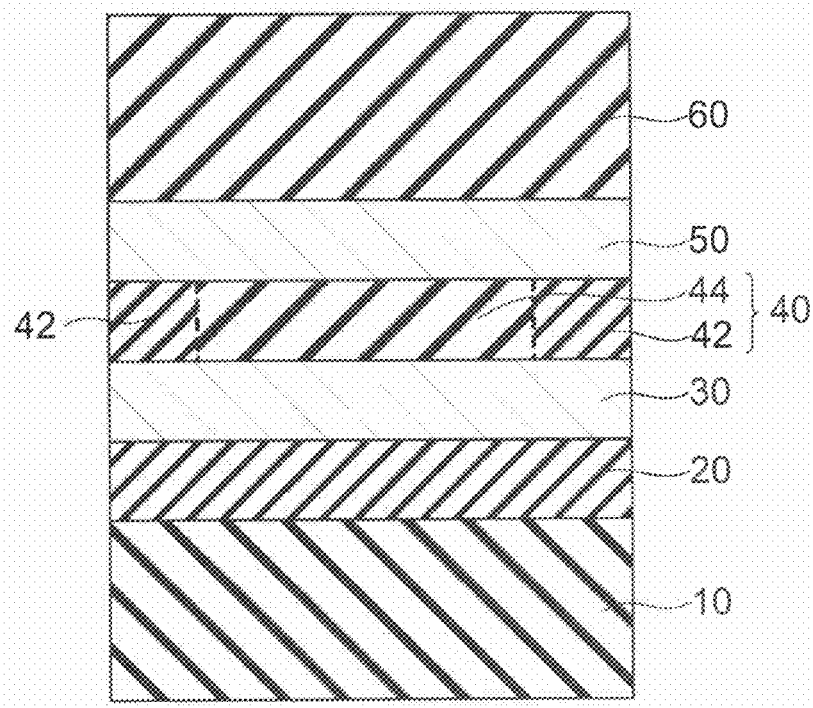
FIG. 1 is a schematic cross-sectional view illustrating the configuration of a nonvolatile memory device according to a first embodiment.

In general, according to one embodiment, a nonvolatile memory device includes a stacked body including a first layer, a second layer and a recording layer. The recording layer is provided between the first layer and the second layer and is capable of reversibly changing between a first state and a second state having a resistance higher than a resistance in the first state by a current supplied via the first layer and the second layer. The recording layer includes a first portion and a second portion provided in a plane of a major surface of the recording layer. The second portion has a nitrogen amount higher than a nitrogen amount in the first portion.

According to one embodiment, a method for manufacturing a nonvolatile memory device is disclosed. The device includes a stacked body including a first layer, a second layer and a recording layer provided between a first layer and a second layer. The recording layer is capable of reversely changing between a first state and a second state having a resistance higher than a resistance in the first state by a current supplied via the first layer and the second layer. The method includes forming a stacked body including a first layer, a recording layer containing nitrogen, and a second layer. In addition, the method includes changing a content of nitrogen in the recording layer through a side face of the recording layer.

According to one embodiment, a method for manufacturing a nonvolatile memory device is disclosed. The device includes a stacked body including a first layer, a second layer and a recording layer provided between a first layer and a second layer. The recording layer is capable of reversely changing between a first state and a second state having a resistance higher than a resistance in the first state by a current supplied via the first layer and the second layer. The method includes forming the recording layer on the first layer. The method includes forming a mask on a major surface of the recording layer. The method includes introducing nitrogen into a portion of the recording layer not covered with the mask with a nitrogen concentration higher than a nitrogen concentration in a portion of the recording layer covered with the mask. The method includes forming the second layer on the recording layer. In addition, the method includes patterning the first layer, the recording layer, and the second layer to form the stacked body including the portion covered with the mask and the portion not covered with the mask.

Embodiments of the invention will now be described with reference to the drawings. In the drawings, like components are marked with the same reference numerals and a detailed description thereof is omitted as appropriate.

First Embodiment

FIG. 1 is a schematic cross-sectional view illustrating the configuration of a nonvolatile memory device according to a first embodiment. That is, the drawing illustrates the configuration of a first specific example of the nonvolatile memory device.

The nonvolatile memory device of this specific example includes: a first interconnection 10; a rectifying element 20 provided on the first interconnection 10; a first electrode (first layer) 30 provided on the rectifying element 20; a phase-change film (recording layer) 40 provided on a major surface of the first electrode 30; a second electrode (second layer) 50 provided on a major surface of the phase-change film 40; and a second interconnection 60 provided on the second electrode 50. That is, the nonvolatile memory device includes a stacked body including the first electrode (first layer) 30, the second electrode (second layer) 50, and the phase-change film (recording layer) 40 provided between the first electrode 30 and the second electrode 50. Here, the "major surface" is a surface perpendicular to the stack direction (the vertical direction in FIG. 1) of the first electrode 30, the phase-change film 40, the second electrode 50, and the like. Here, the phase-change film 40 contains nitrogen in the whole or a part thereof, and includes: a second portion (a high nitrogen concentration portion 44) having a relatively high nitrogen concentration on the inner side in a plane of the major surface and; a first portion (a low nitrogen concentration portion 42) having a relatively low nitrogen concentration on the outer side in a plane of the major surface. That is, the low nitrogen concentration portion 42 is provided so as to surround the high nitrogen concentration portion 44 in a plane of the major surface.

Furthermore, a heater layer (not illustrated) made of a material with a resistivity of, for example, about $10^{-5}$ Ωcm or more may be provided on the first electrode 30 side or the second electrode 50 side in order to efficiently perform the heating of the phase-change film 40 in the erase operation.

The rectifying element 20 is formed of, for example, a diode.

The first electrode 30 and the second electrode 50 may be made of a material hard to oxidize in view of the case where oxidation treatment is performed on the entire device. The following compounds are given as examples of such a material.

(a) MN

"M" is at least one element selected from the group consisting of Ti, Zr, Hf, V, Nb, and Ta. "N" is nitrogen.

(b) $MO_x$

"M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. "x" satisfies $1 \leq x \leq 4$. "O" is oxygen.

(c) $AMO_3$

"A" is at least one element selected from the group consisting of La, K, Ca, Sr, Ba, and Ln (lanthanoids).

"M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. "O" is oxygen.

(d) $A_2MO_4$

"A" is at least one element selected from the group consisting of K, Ca, Sr, Ba, and Ln (lanthanoids).

"M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. "O" is oxygen.

The first electrode 30 and the second electrode 50 made of these materials function also as a protection film.

The phase-change film 40 contains a material that changes between a crystal state and an amorphous state by applying a voltage. Specifically, chalcogenide-based materials are given as this material. "Chalcogenide" is a general term of compounds containing a group 16 element such as Se and Te, derived from a synonym of the group 16 elements, the "chalcogens." For example, a material containing Se or Te is given as a specific material. More specifically, $Ge_2Sb_2Te_5$, GeSbTe, SbTe, AsSbTe, SeSbTe, AgInSbTe, and the like are given.

In the specification of the application, "crystal" refers to not only a complete crystal but also single crystals having a defect and polycrystalline states. On the other hand, "amorphous" refers to not only materials having a completely disordered atomic arrangement but also those having a short range periodic structure and those containing fine crystal particles in a disordered matrix.

The phase-change film 40 is fabricated by introducing nitrogen into the whole or a part of the material mentioned above. The purpose of introducing nitrogen is to stabilize the crystalline state or the amorphous state. Introducing nitrogen raises the phase-change temperature, and this suppresses a phase change. Thereby, the recorded information becomes hard to erase, and nonvolatile properties are ensured. The high nitrogen concentration portion 44 is a portion having a relatively high nitrogen concentration, and the low nitrogen concentration portion 42 is a portion having a relatively low nitrogen concentration.

Figure 2:
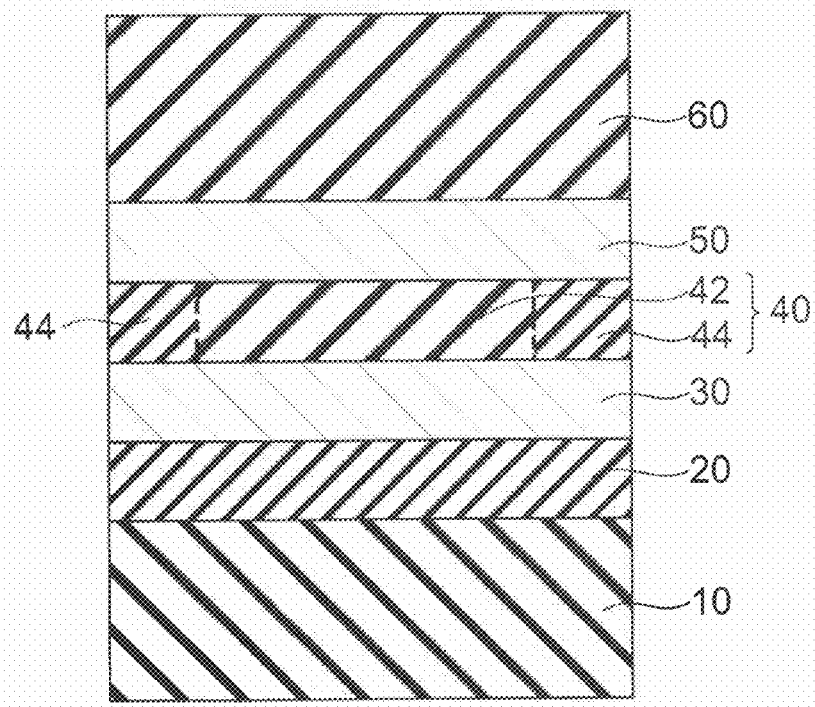
FIG. 2 is a schematic cross-sectional view illustrating the configuration of another nonvolatile memory device according to the first embodiment.

FIG. 2 is a schematic cross-sectional view illustrating the configuration of another nonvolatile memory device according to the first embodiment. That is, the drawing illustrates a second specific example of the nonvolatile memory device.

The nonvolatile memory device of this specific example includes; the first interconnection 10; the rectifying element 20 provided on the first interconnection 10; the first electrode 30 provided on the rectifying element 20; the phase-change film 40 provided on the major surface of the first electrode 30; the second electrode 50 provided on the major surface of the phase-change film 40; and the second interconnection 60 provided on the second electrode 50. Here, the phase-change film 40 contains nitrogen in the whole or a part thereof, and includes: the first portion (the low nitrogen concentration portion 42) having a relatively low nitrogen concentration on the inner side in a plane of the major surface; and the second portion (the high nitrogen concentration portion 44) having a relatively high nitrogen concentration on the outer side in a plane of the major surface. That is, the high nitrogen concentration portion 44 is provided so as to surround the low nitrogen concentration portion 42 in a plane of the major surface.

Also in this specific example, a heater layer (not illustrated) made of a material with a resistivity of, for example, about $10^{-5}$ Ωcm or more may be provided on the first electrode 30 side or the second electrode 50 side in order to efficiently perform the heating of the phase-change film 40 in the erase operation.

The configuration, material, and the like of the rectifying element 20, the first electrode 30, the second electrode 50, and the phase-change film 40 of this specific example may be similar to those described above in regard to the first specific example.

The difference of the second specific example with the first specific example is that the high nitrogen concentration portion 44 and the low nitrogen concentration portion 42 are reversely positioned each other. That is, whereas the low nitrogen concentration portion 42 is disposed on the outer side in a plane of the major surface in the first specific example, the low nitrogen concentration portion 42 is disposed on the inner side in a plane of the major surface in the second specific example.

In this embodiment, portions with different nitrogen concentrations exist in a plane of the major surface in the phase-change film 40. In the first specific example and the second specific example, portions with different nitrogen concentrations exist in a plane of the major surface in the phase-change film 40.

Next, the mechanism of the record, erase, and read operations of the nonvolatile memory device according to this embodiment will now be described with reference to FIGS. 3A to 3C.

FIG. 3A to FIG. 3C are conceptual views illustrating the operation of the nonvolatile memory device according to the first embodiment. That is, FIG. 3A is a schematic cross-sectional view illustrating the portion in and around the phase-change film 40 of the nonvolatile memory device according to this embodiment. FIG. 3B is a schematic view illustrating the structure of the amorphous state of a chalcogenide, specifically $Ge_2Sb_2Te_5$, which may be the material of the phase-change film 40. In this case, this compound has a structure made of various kinds of rings such as a four-membered ring, six-membered ring, and eight-membered ring. On the other hand, FIG. 3C is a schematic view illustrating the structure of the crystalline state of $Ge_2Sb_2Te_5$. In this case, this compound has a structure made of only four-membered rings, six-membered rings, and eight-membered rings.

Chalcogenides such as $Ge_2Sb_2Te_5$ used for the phase-change film 40 present a phase change when heat is applied, and change between the low resistive crystalline state and the high resistive amorphous state. In the specific example illustrated in FIG. 3A to FIG. 3C, the amorphous state (FIG. 3B) is the initial state; and when this state phase-changes into the crystal state (FIG. 3C), the writing is performed. Conversely, when a phase change from the crystalline state (FIG. 3C) to the amorphous state (FIG. 3B) occurs, the written information is erased. Also a system is possible in which the crystalline state (FIG. 3C) is taken as the initial state and the writing is performed when this state phase-changes into the amorphous state (FIG. 3B).

The recording (writing) of information in the phase-change film 40 is performed by applying a voltage to the phase-change film 40 to pass a current pulse. The Joule heat generated at this time heats the phase-change film 40 to the crystallization temperature or higher. This temperature is kept for a certain period of time, for example, a time shorter than one microsecond. Then, the phase-change film 40 is cooled slowly to be phase-changed into the crystalline state. Thereby, information is written.

The erasing of information in the phase-change film 40 is performed by the Joule heat generated by passing a large current pulse through the phase-change film 40. This Joule heat heats the phase-change film 40 to the melting point (in the case of $Ge_2Sb_2Te_5$, the melting point is 633° C.) or higher. Then, the phase-change film 40 is cooled rapidly in a time shorter than, for example, 100 nanoseconds to be phase-changed into the amorphous state. Thereby, information is erased.

The reading of information in the phase-change film 40 is performed by applying a voltage to the phase-change film 40 to pass a current pulse and detecting the resistance value. The amplitude of the current pulse is set to be small not to cause a phase change in the material of the phase-change film 40.

Next, an example of the characteristics of the nonvolatile memory device according to this embodiment will now be described with reference to FIGS. 4A and 4B.

This embodiment can reduce power consumption, for example.

Figure 4A:
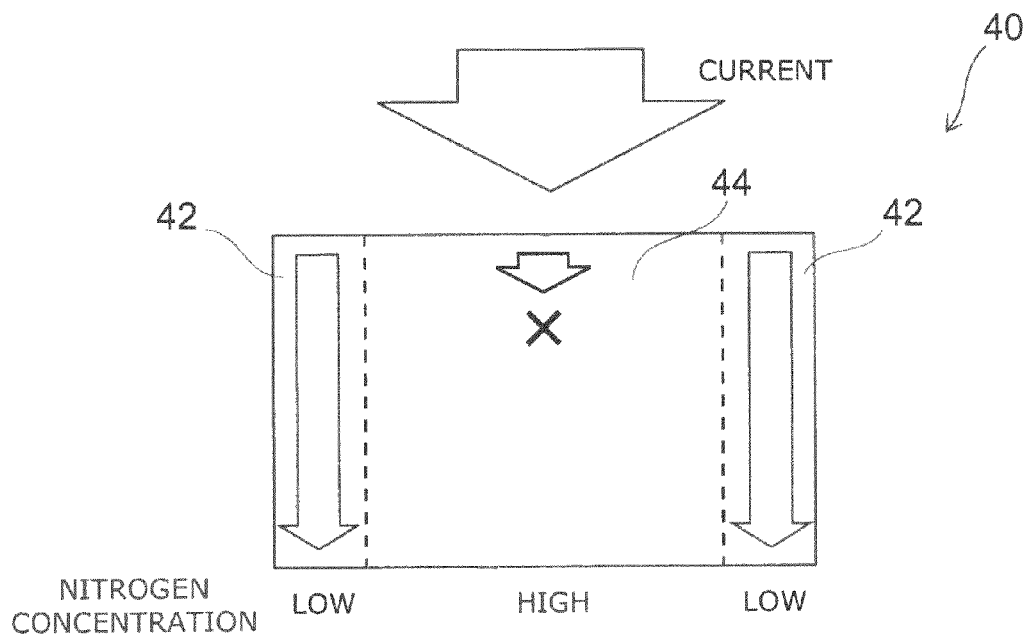
FIG. 4A and FIG. 4B are schematic cross-sectional views illustrating the operation of the phase-change film in the nonvolatile memory device according to the first embodiment.
Figure 4B:
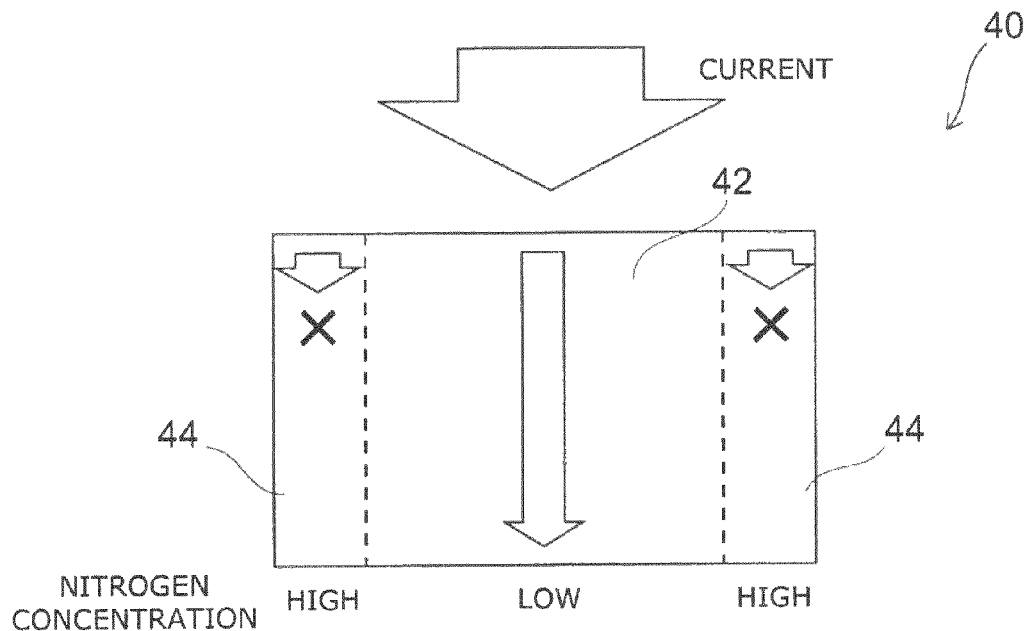

FIG. 4A and FIG. 4B are schematic cross-sectional views illustrating the operation of the phase-change film in the nonvolatile memory device according to the first embodiment. FIG. 4A illustrates the operation of the first specific example. In the first specific example, the phase-change film 40 includes the high nitrogen concentration portion 44 on the inner side in a plane of the major surface and the low nitrogen concentration portion 42 on the outer side in a plane of the major surface.

Here, introducing nitrogen into a chalcogenide raises the resistivity with the amount of introduced nitrogen. Accordingly, when the high nitrogen concentration portion 44 is made the amorphous state, the low nitrogen concentration portion 42 has a resistivity lower than the resistivity of the high nitrogen concentration portion 44, irrespective of whether the low nitrogen concentration portion 42 is in the crystalline state or the amorphous state. This can bring about a situation in which a current flows preferentially through the low nitrogen concentration portion 42 and hardly through the high nitrogen concentration portion 44. Consequently, a current can be passed preferentially through the low nitrogen concentration portion 42 to phase-change only the low nitrogen concentration portion 42. Although it is necessary to melt the low nitrogen concentration portion 42 when the low nitrogen concentration portion 42 is phase-changed from the crystal state to the amorphous state, also at this time the low nitrogen concentration portion 42 can be phase-changed into the amorphous state by passing a current pulse preferentially only through the low nitrogen concentration portion 42 to melt locally only the low nitrogen concentration portion, and performing rapid cooling. In other words, the low nitrogen concentration portion 42 can be phase-changed from the crystalline state to the amorphous state and from the amorphous state to the crystalline state while the high nitrogen concentration portion 44 is fixed in the amorphous state. When the low nitrogen concentration portion 42 is melted, also the temperature of the adjacent high nitrogen concentration portion 44 may rise to some extent. However, when the low nitrogen concentration portion 42 is phase-changed into the amorphous state, rapid cooling is performed after the heating. Therefore, the crystallization of the adjacent high nitrogen concentration portion 44 can be suppressed. Furthermore, introducing nitrogen into a chalcogenide raises the phase-change (crystallization) temperature with the amount of introduced nitrogen. In other words, by raising the crystallization temperature of the high nitrogen concentration portion 44, the crystallization of the high nitrogen concentration portion 44 can be suppressed even if the adjacent low nitrogen concentration portion 42 is heated.

As described above, this embodiment can generate a phase change only in the low nitrogen concentration portion 42 while the high nitrogen concentration portion 44 is fixed in the amorphous state (not causing a phase change from the amorphous state to the crystal state). In other words, a situation can be brought about in which a current flows only through the low nitrogen concentration portion 42 and does not flow through the high nitrogen concentration portion 44. Consequently, the first specific example can reduce the amount of a current flowing through the phase-change film 40 to reduce power consumption as compared with conventional phase-change films having a uniform nitrogen concentration.

FIG. 4B illustrates the operation of the second specific example. Similarly to the first specific example, a situation can be brought about in which a current flows only through the low nitrogen concentration portion 42 and does not flow through the high nitrogen concentration portion 44 in the phase-change film 40. In other words, also the second specific example can reduce the amount of a current flowing through the phase-change film 40 to reduce power consumption as compared with conventional phase-change films having a uniform nitrogen concentration.

Next, the second specific example can prevent the penetration of impurities into the phase-change film 40.

Figure 5:
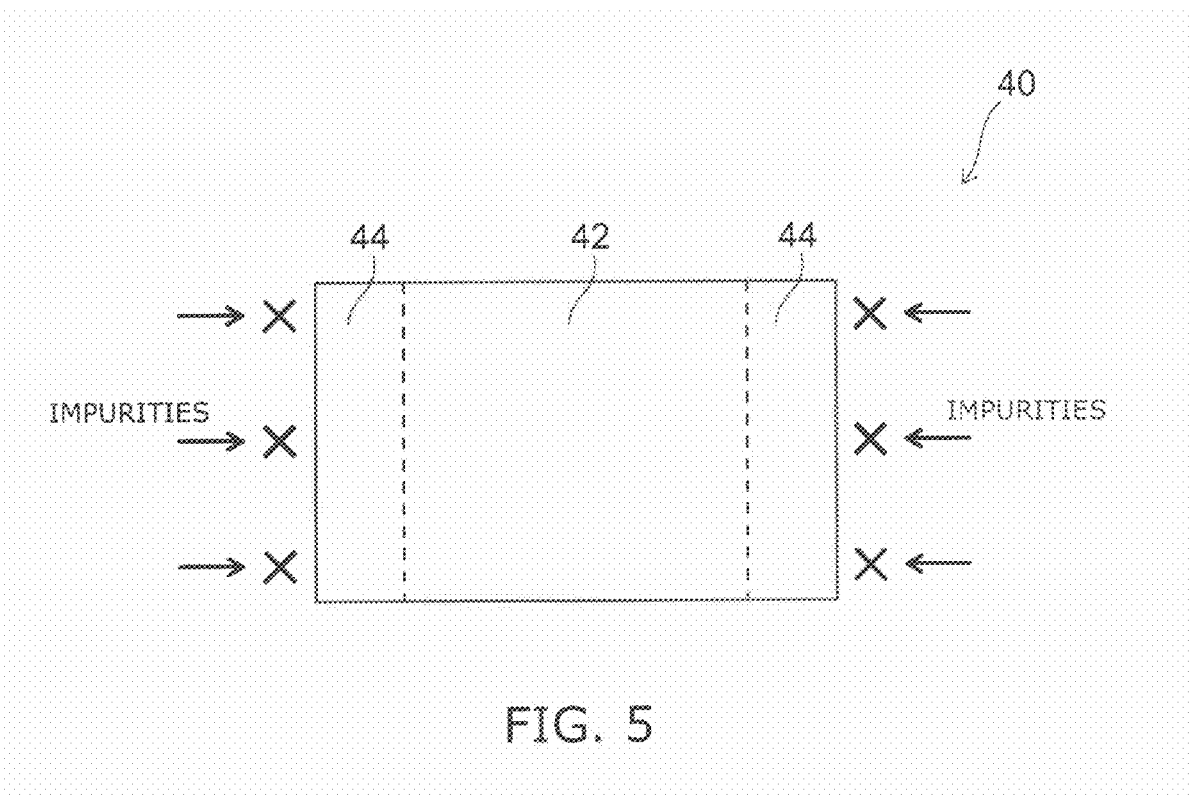
FIG. 5 is a schematic cross-sectional view illustrating the operation of the phase-change film in the nonvolatile memory device according to the first embodiment.

FIG. 5 is a schematic cross-sectional view illustrating the operation of the phase-change film in the nonvolatile memory device according to the first embodiment. That is, the drawing is a schematic cross-sectional view of the phase-change film 40 for describing an example of the characteristics of the second specific example.

In this embodiment, a phase change is generated in the low nitrogen concentration portion 42 to perform the writing and erasing of information. Therefore, it is necessary for the low nitrogen concentration portion 42 to have current/resistance characteristics, a phase-change temperature, and the like in a prescribed range for a stable operation. However, if impurities get mixed in the low nitrogen concentration portion 42, the electric resistance or the phase-change temperature may vary to impede obtaining prescribed operating characteristics.

In contrast, in the second specific example, the high nitrogen concentration portion 44 containing nitrogen introduced with a high concentration is provided on the outside of the low nitrogen concentration portion 42. The high nitrogen concentration portion 44 in which nitrogen is introduced at high concentration functions as a protection barrier, and impurities penetrate less readily into the low nitrogen concentration portion 42 from the exterior such as an inter-element insulating film. In other words, the second specific example can prevent the penetration of impurities into the low nitrogen concentration portion 42 of the phase-change film 40. This can prevent a variation in operating characteristics caused by the diffusion penetration of impurities into the low nitrogen concentration portion 42, even in those cases where the yield decreases due to the penetration of impurities into the low nitrogen concentration portion 42 in the course of the manufacturing process of the nonvolatile memory device, or the writing and erasing are repeated in the manufactured nonvolatile memory device under various environments. Thus, long-term reliability can be improved.

Second Embodiment

Next, a method for manufacturing a nonvolatile memory device that is a second embodiment will now be described with reference to the drawings.

First, a method for manufacturing the nonvolatile memory device of the first specific example is described.

Figure 6A:
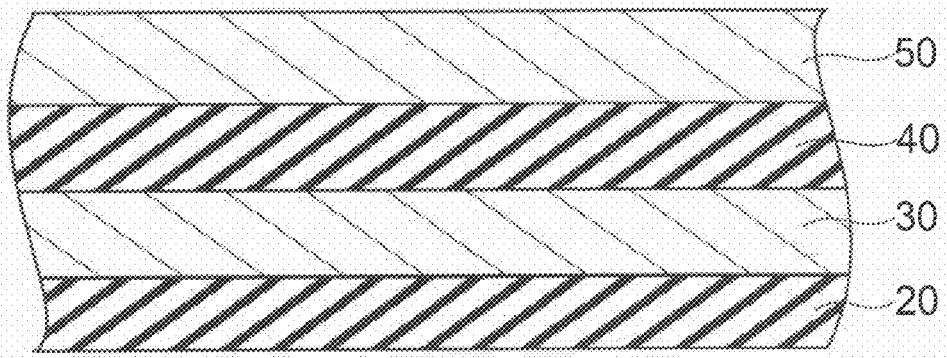
FIG. 6A to FIG. 6C are schematic cross-sectional views in order of the processes illustrating a method for manufacturing a nonvolatile memory device according to a second embodiment.
Figure 6B:
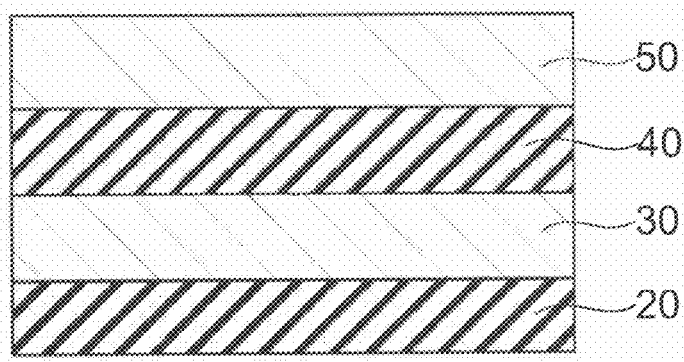
Figure 6C:
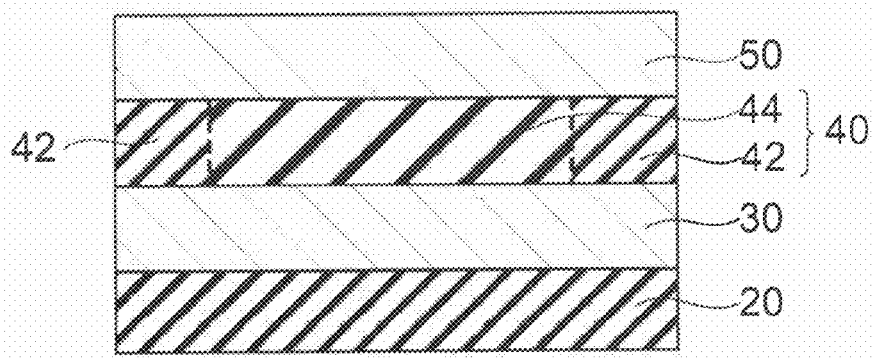

FIG. 6A to FIG. 6C are schematic cross-sectional views in order of the processes illustrating a method for manufacturing a nonvolatile memory device according to the second embodiment.

First, as illustrated in FIG. 6A, the rectifying element 20 is formed on the not-illustrated first interconnection 10. The first electrode 30 is formed on the rectifying element 20. The phase-change film 40 containing nitrogen is formed on the first electrode 30. In the case where the phase-change film 40 is formed by sputtering, nitrogen can be introduced by sputtering under a nitrogen atmosphere with a flow rate ratio of nitrogen gas and argon gas ($N_2$/Ar) of 1 to 10%, for example. The second electrode 50 is formed on the phase-change film 40. The not-illustrated second interconnection 60 is formed on the second electrode 50.

Then, as illustrated in FIG. 6B, this stacked body is patterned by etching or the like. The etching is performed to the depth of the interface between the first interconnection 10 and the rectifying element 20.

Then, as illustrated in FIG. 6C, nitrogen is removed through the side face of the phase-change film 40. Anneal under reduced pressure or vacuum, for example, is given as the removal method. By the etching described above, the side face of the phase-change film 40 is damaged. If anneal under reduced pressure or vacuum is performed in this state, nitrogen near the side face of the phase-change film 40 is released. Thereby, the nitrogen concentration becomes relatively low on the outer side in a plane of the major surface of the phase-change film 40. Consequently, the high nitrogen concentration portion 44 is formed on the inner side in a plane of the major surface, and the low nitrogen concentration portion 42 is formed on the outer side in a plane of the major surface. Furthermore, also a method is effective in which the side face of the phase-change film 40 is exposed to, for example, plasma of an inert gas or is reformed by being irradiated with an ion beam or electron beam before the anneal. The plasma, electron beam, and the like can make a physical or chemical impact on the side face of the phase-change film 40 to change the bonding state of elements near the side face and/or to introduce defects. This allows the detachment of nitrogen to be facilitated.

FIG. 7A to FIG. 7C and FIG. 8A and FIG. 8B are schematic cross-sectional views in order of the processes illustrating another method for manufacturing a nonvolatile memory device according to the second embodiment. That is, these drawings are process cross-sectional views illustrating another example of the method for manufacturing the nonvolatile memory device of the first specific example.

Figure 7A:
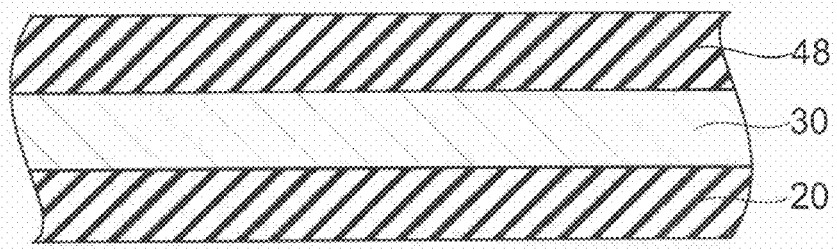
FIG. 7A to FIG. 7C and FIG. 8A and FIG. 8B are schematic cross-sectional views in order of the processes illustrating another method for manufacturing a nonvolatile memory device according to the second embodiment.

First, as illustrated in FIG. 7A, the rectifying element 20 is formed on the not-illustrated first interconnection 10. The first electrode 30 is formed on the rectifying element 20. A phase-change material film 48 containing no nitrogen is formed on the first electrode 30.

Figure 7B:
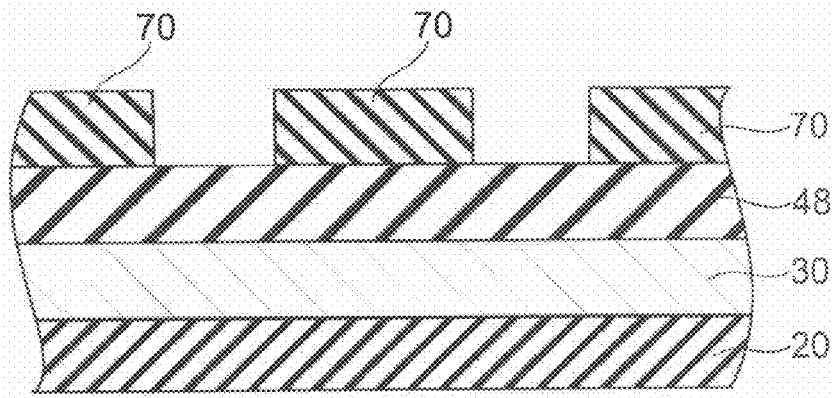

Then, as illustrated in FIG. 7B, a dummy mask 70 is formed on the phase-change material film 48.

Figure 7C:
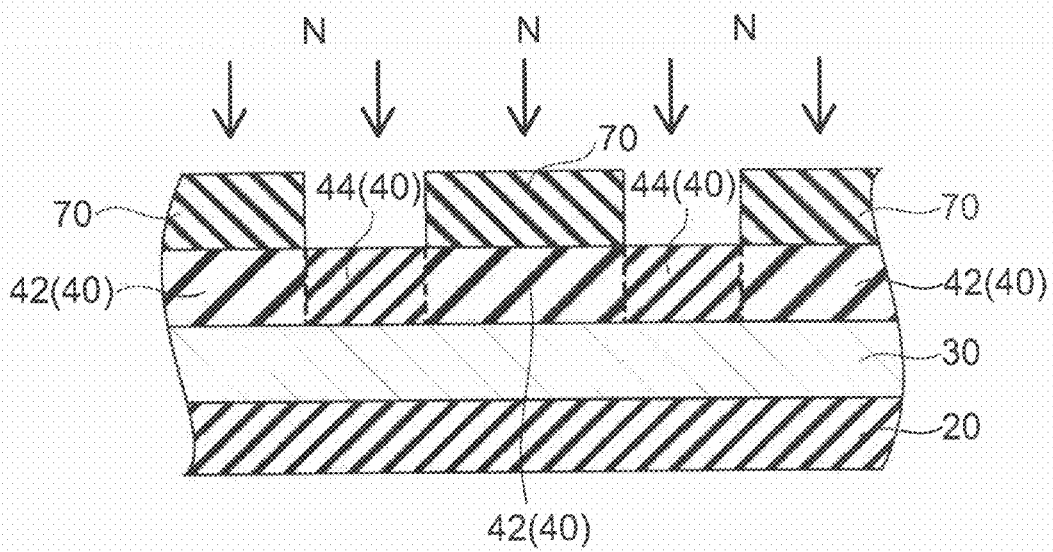

Then, as illustrated in FIG. 7C, nitrogen is introduced into the phase-change material film 48 by using the dummy mask 70 as a mask. The ion implantation method, the vapor phase diffusion method, a method using nitrogen plasma or nitrogen radicals, and the like are given as the introduction method. Thereby, the phase-change film 40 that includes the high nitrogen concentration portion 44 having a relatively high nitrogen concentration and the low nitrogen concentration portion 42 having a relatively low nitrogen concentration is formed.

Figure 8A:
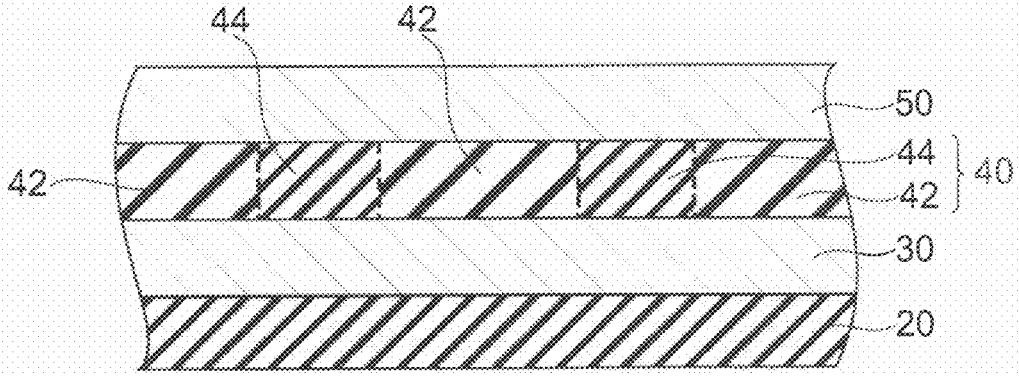

Then, as illustrated in FIG. 8A, the dummy mask 70 is removed. Then, the second electrode 50 is formed on the phase-change film 40. Then, the not-illustrated second interconnection 60 is formed on the second electrode 50.

Figure 8B:
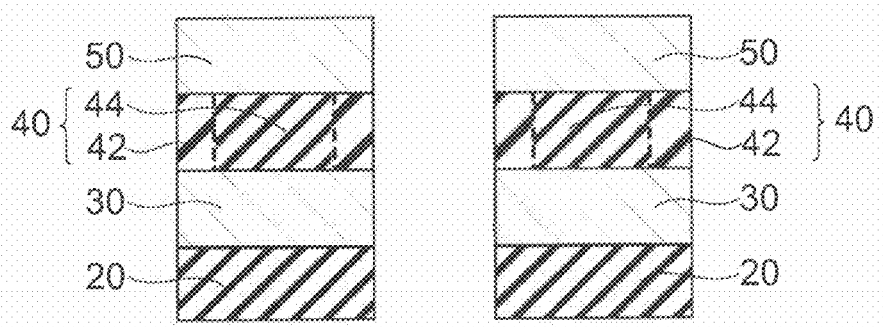

After that, as illustrated in FIG. 8B, patterning is performed by etching or the like through a face immediately above a central portion of the low nitrogen concentration portion 42. The etching is performed to the depth of the interface between the first interconnection 10 and the rectifying element 20. Thereby, the nonvolatile memory device of the first specific example that includes the high nitrogen concentration portion 44 on the inner side in a plane of the major surface and the low nitrogen concentration portion 42 on the outer side in a plane of the major surface is fabricated.

Next, a method for manufacturing the nonvolatile memory device of the second specific example will now be described with reference to FIG. 9A to FIG. 11B.

Figure 9A:
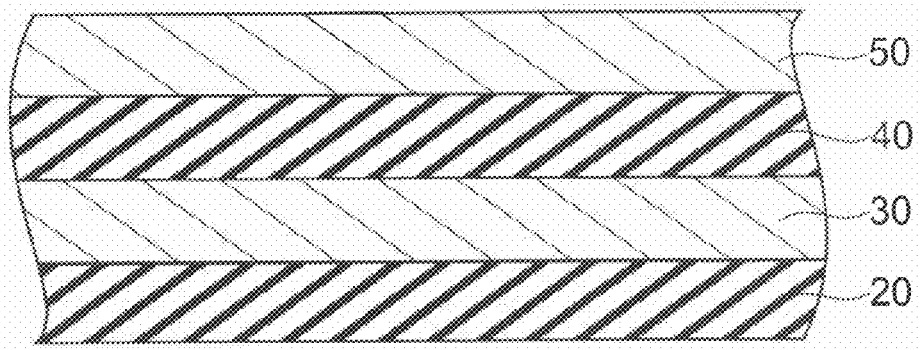
FIG. 9A to FIG. 9C are schematic cross-sectional views in order of the processes illustrating another method for manufacturing a nonvolatile memory device according to the second embodiment.
Figure 9B:
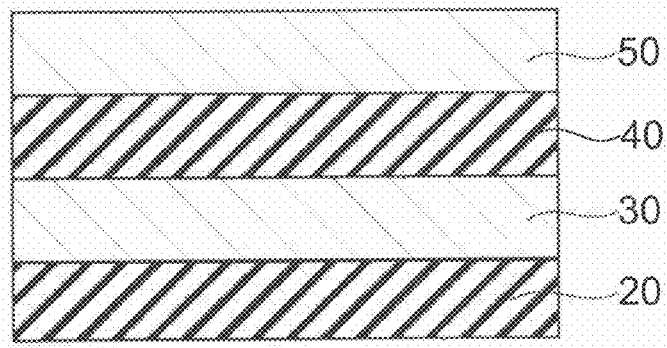
Figure 9C:
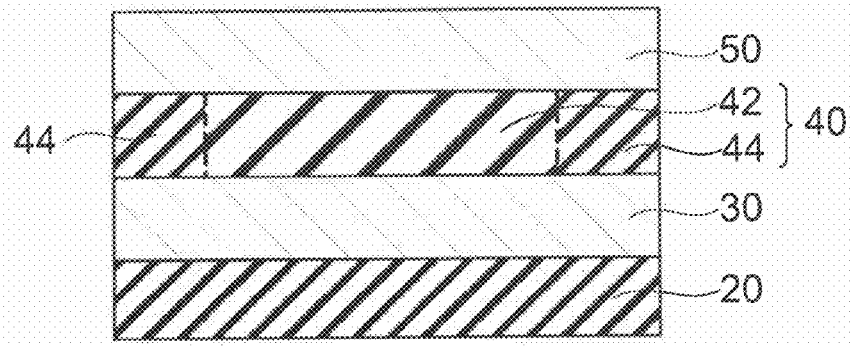

FIG. 9A to FIG. 9C are schematic cross-sectional views in order of the processes illustrating another method for manufacturing a nonvolatile memory device according to the second embodiment. That is, the drawings are process cross-sectional views illustrating an example of the method for manufacturing the nonvolatile memory device of the second specific example.

First, as illustrated in FIG. 9A, the rectifying element 20 is formed on the not-illustrated first interconnection 10. The first electrode 30 is formed on the rectifying element 20. The phase-change film 40 containing nitrogen is formed on the first electrode 30. In the process of fabricating the phase-change film 40, nitrogen can be introduced by, as described above, sputtering under a nitrogen atmosphere with a flow rate ratio of nitrogen gas and argon gas ($N_2$/Ar) of 1 to 10%, for example. The second electrode 50 is formed on the phase-change film 40. The not-illustrated second interconnection 60 is formed on the second electrode 50.

Then, as illustrated in FIG. 9B, patterning is performed by etching or the like. The etching is performed to the depth of the interface between the first interconnection 10 and the rectifying element 20.

Then, as illustrated in FIG. 9C, nitrogen is introduced through the side face of the phase-change film 40. Annealing under an atmosphere containing nitrogen gas or exposing to nitrogen plasma or nitrogen radicals, for example, may be given as the introduction method. The nitrogen concentration becomes relatively high on the outer side in a plane of the major surface of the phase-change film 40. Consequently, the low nitrogen concentration portion 42 is formed on the inner side in a plane of the major surface, and the high nitrogen concentration portion 44 is formed on the outer side in a plane of the major surface. In this nitrogen introduction process, for example, also components other than the phase-change film 40 can be nitrided at the same time. For example, nitrogen may be introduced into the rectifying element 20 to obtain prescribed rectifying characteristics.

FIG. 10A to FIG. 10C and FIG. 11A and FIG. 11B are schematic cross-sectional views in order of the processes illustrating another method for manufacturing a nonvolatile memory device according to the second embodiment. That is, these drawings are process cross-sectional views illustrating another example of the method for manufacturing the nonvolatile memory device of the second specific example.

Figure 10A:
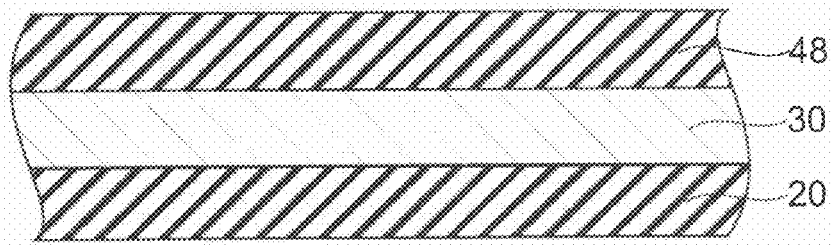
FIG. 10A to FIG. 10C and FIG. 11A and FIG. 11B are schematic cross-sectional views in order of the processes illustrating another method for manufacturing a nonvolatile memory device according to the second embodiment.

First, as illustrated in FIG. 10A, the rectifying element 20 is formed on the not-illustrated first interconnection 10. The first electrode 30 is formed on the rectifying element 20. The phase-change material film 48 containing no nitrogen is formed on the first electrode 30.

Figure 10B:
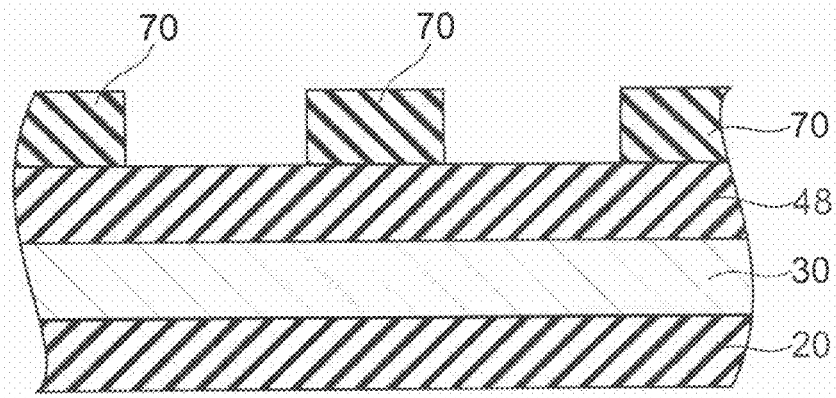

Then, as illustrated in FIG. 10B, the dummy mask 70 is formed on the phase-change material film 48.

Figure 10C:
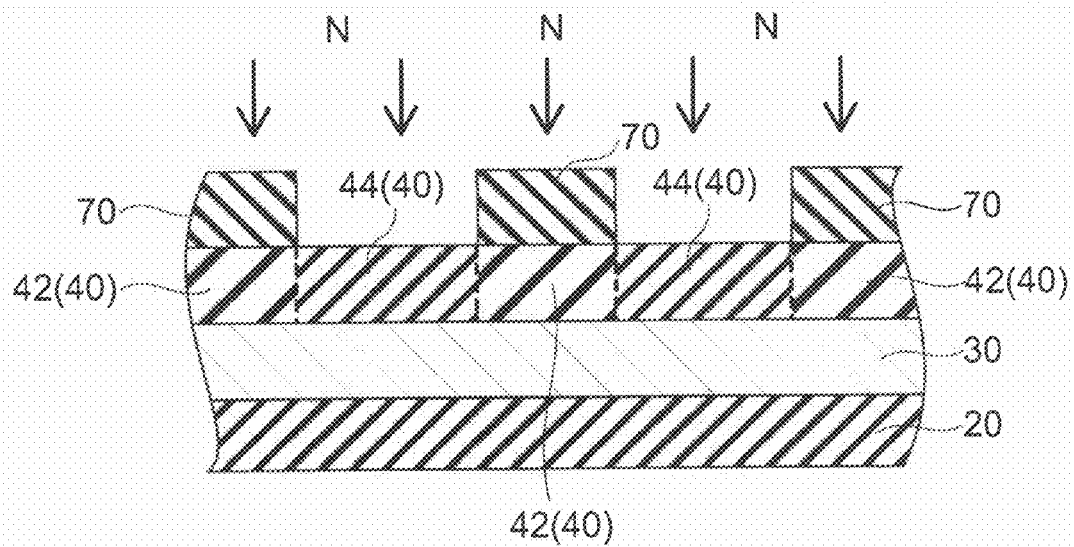

Then, as illustrated in FIG. 10C, nitrogen is introduced into the phase-change material film 48 by using the dummy mask 70 as a mask. Ion implantation and the like are given as the introduction method. Thereby, the phase-change film 40 that includes the high nitrogen concentration portion 44 having a relatively high nitrogen concentration and the low nitrogen concentration portion 42 having a relatively low nitrogen concentration is formed.

Figure 11A:
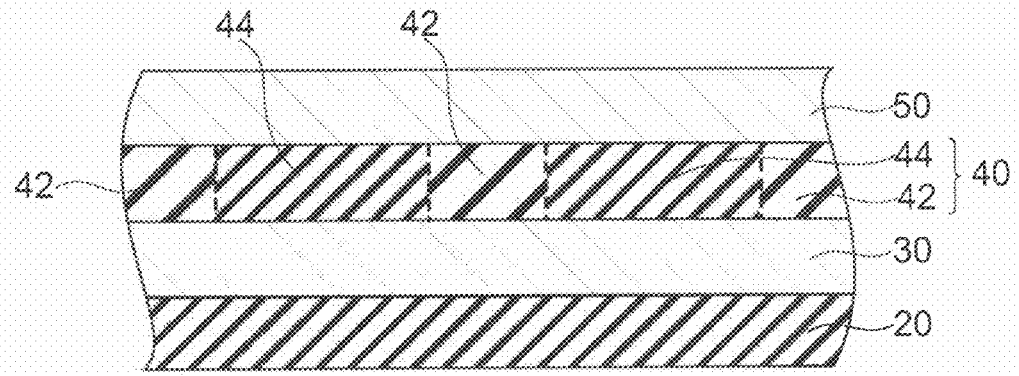

Then, as illustrated in FIG. 11A, the dummy mask 70 is removed. Then, the second electrode 50 is formed on the phase-change film 40. Then, the not-illustrated second interconnection 60 is formed on the second electrode 50.

Figure 11B:
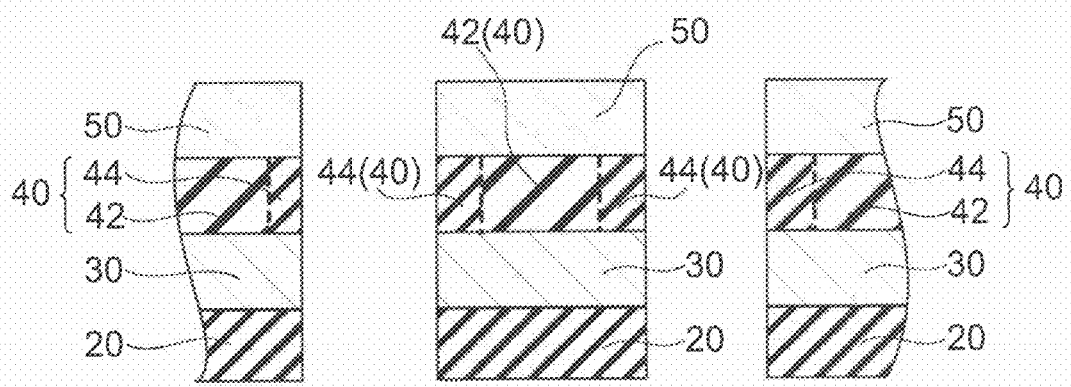

After that, as illustrated in FIG. 11B, patterning is performed by etching or the like through a face immediately above a central portion of the high nitrogen concentration portion 44. The etching is performed to the depth of the interface between the first interconnection 10 and the rectifying element 20. Thereby, the nonvolatile memory device of the second specific example that includes the low nitrogen concentration portion 42 on the inner side in a plane of the major surface and the high nitrogen concentration portion 44 on the outer side in a plane of the major surface in the phase-change film 40 is fabricated.

In the process of FIG. 9A in the specific example mentioned above, the phase-change film 40 containing nitrogen is formed on the first electrode 30. However, the phase-change material film 48 containing no nitrogen may be formed.

Furthermore, in the processes of FIG. 7A and FIG. 10A in the specific examples mentioned above, the phase-change material film 48 containing no nitrogen is formed on the first electrode 30. However, the phase-change film 40 containing nitrogen at low concentration may be formed.

Third Embodiment

Next, a third embodiment will now be described with reference to FIG. 12.

Figure 12:
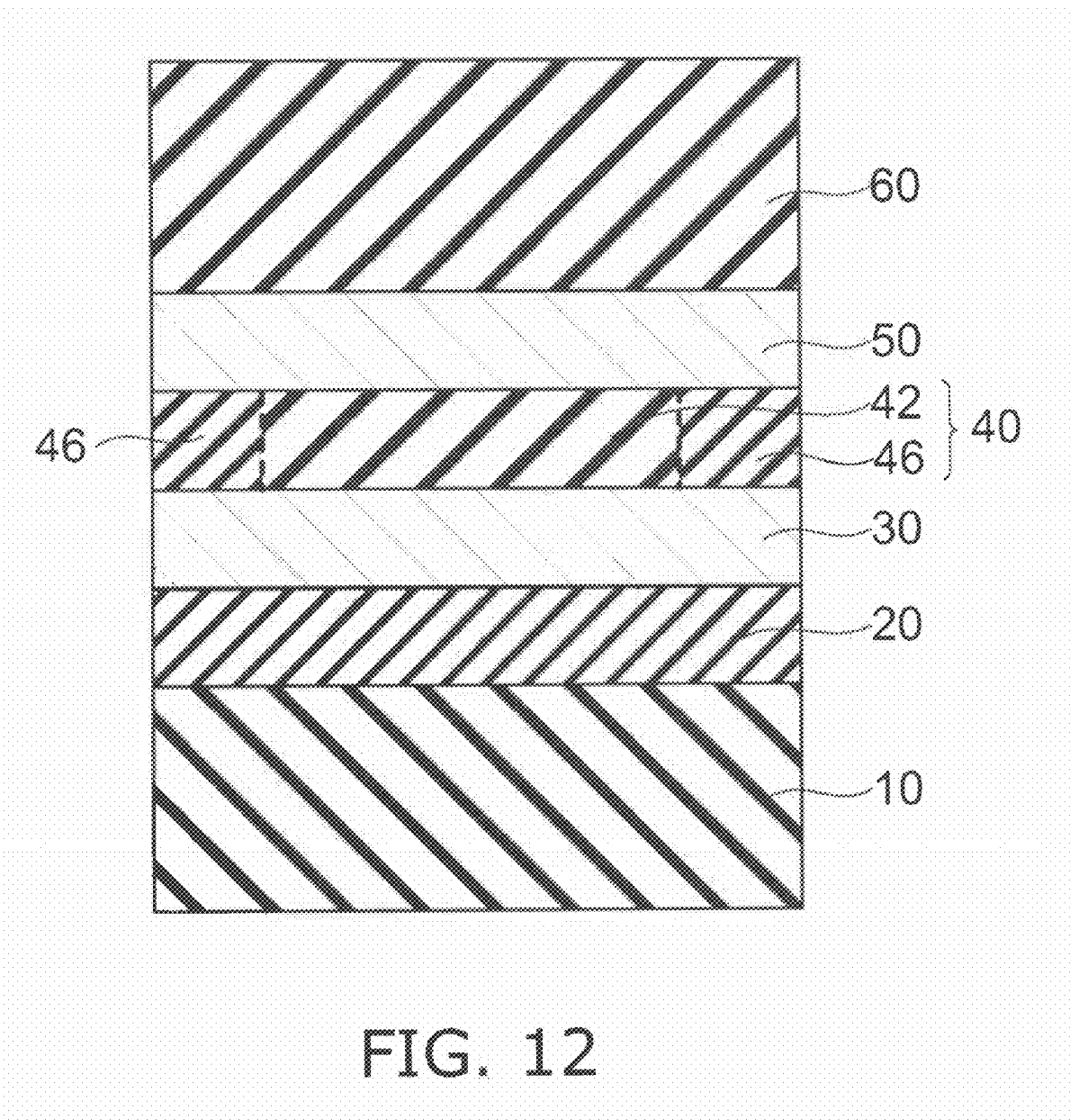
FIG. 12 is a schematic cross-sectional view illustrating the configuration of a nonvolatile memory device according to a third embodiment.

FIG. 12 is a schematic cross-sectional view illustrating the configuration of a nonvolatile memory device according to the third embodiment. That is, the drawing illustrates the configuration of a third specific example according to this embodiment.

The nonvolatile memory device of this specific example includes: the first interconnection 10; the rectifying element 20 provided on the first interconnection 10; the first electrode 30 provided on the rectifying element 20; the phase-change film 40 provided on the first electrode 30; the second electrode 50 provided on the phase-change film 40; and the second interconnection 60 provided on the second electrode 50. Here, the phase-change film 40 contains nitrogen in the whole or a part thereof and oxygen in a part thereof, and includes: a portion (the low nitrogen concentration portion 42) that contains nitrogen at a relatively low concentration and no oxygen on the inner side in a plane of the major surface; and a portion (a nitrogen/oxygen-introduced portion 46) that contains nitrogen at a relatively high concentration and oxygen on the outer side in a plane of the major surface.

Furthermore, also in this embodiment, a heater layer (not illustrated) made of a material with a resistivity of about $10^{-5}$ Ωcm or more, for example, may be provided on the first electrode 30 side or the second electrode 50 side in order to efficiently perform the heating of the phase-change film 40 in the erase operation.

The configuration, material, and the like of the rectifying element 20, the first electrode 30, the second electrode 50, and the phase-change film 40 may be similar to those described above in regard to the first embodiment. However, the phase-change film 40 contains oxygen in a part thereof (on the outer side in a plane of the major surface).

The third specific example may be similar to the second specific example, except that oxygen is introduced on the outer side in a plane of the major surface of the phase-change film 40.

As described above in regard to the first embodiment, in the phase-change nonvolatile memory device, the effects of the reduction of power consumption and a protection barrier against the penetration of impurities are obtained by using the nitrogen concentration distribution in the direction of a plane of the major surface of the phase-change film 40. In this embodiment, oxygen is introduced in addition to nitrogen into the phase-change film 40.

An example of the characteristics of the third specific example will now be described.

Similarly to the second specific example, high concentration nitrogen exists on the outer side in a plane of the major surface of the phase-change film 40 also in the third specific example. Furthermore, also oxygen is introduced on the outer side in a plane of the major surface of the phase-change film 40. Here, introducing oxygen into a chalcogenide raises the resistivity and the phase-change temperature as in the case where nitrogen is introduced. This can bring about a situation in which a current flows preferentially in the low nitrogen concentration portion 42 and hardly in the nitrogen/oxygen-introduced portion 46 in the phase-change film 40, as described above in regard to the first embodiment.

Therefore, also this specific example can reduce the amount of a current flowing through the phase-change film 40 to reduce power consumption.

In this specific example, by the introduction of oxygen, the resistivity and phase-change temperature of the nitrogen/oxygen-introduced portion 46 can be made still higher than the resistivity and phase-change temperature of the high nitrogen concentration portion 44 in the case of the second specific example. Accordingly, the power consumption is further reduced. In other words, a current flowing through the nitrogen/oxygen-introduced portion 46 can be further suppressed and also crystallization can be further suppressed. This allows the low nitrogen concentration portion 42 to be phase-changed stably and the allowable range of current conditions of the writing, erasing, and reading-out to be expanded.

Furthermore, the existence of nitrogen and oxygen at high concentration enables to suppress the penetration of impurities into the low nitrogen concentration portion 42 from the exterior such as an inter-element insulating film. Accordingly, in the third specific example, the nitrogen/oxygen-introduced portion 46 functions as a protection barrier as in the case of the second specific example.

Fourth Embodiment

Next, a method for manufacturing a nonvolatile memory device that is a fourth embodiment will now be described.

Figure 13A:
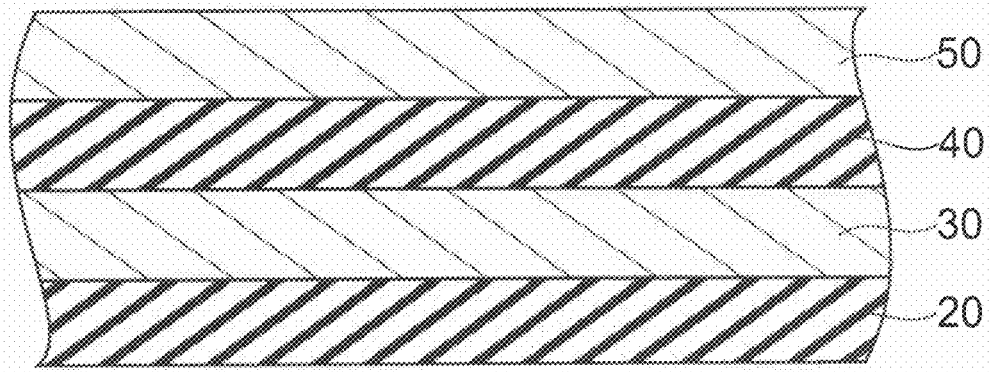
FIG. 13A to FIG. 13C are schematic cross-sectional views in order of the processes illustrating a method for manufacturing a nonvolatile memory device according to a fourth embodiment.
Figure 13B:
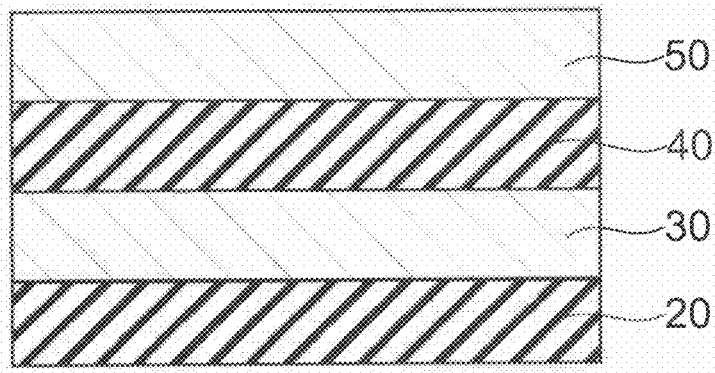
Figure 13C:
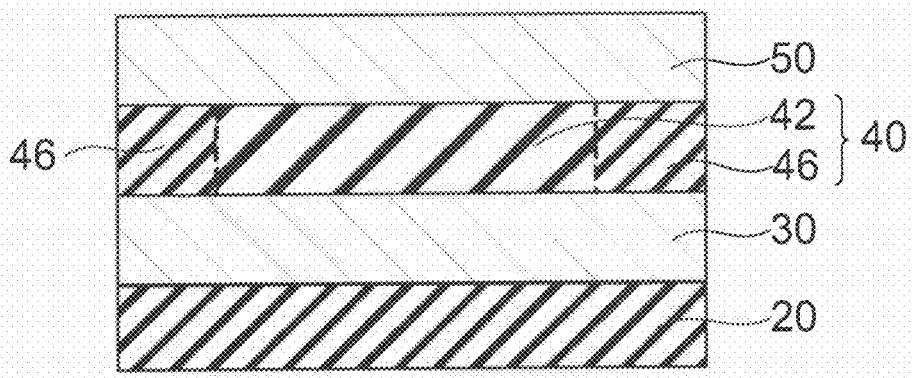

FIG. 13A to FIG. 13C are schematic cross-sectional views in order of the processes illustrating a method for manufacturing a nonvolatile memory device according to the fourth embodiment. That is, these drawings are process cross-sectional views illustrating an example of the method for manufacturing the nonvolatile memory device of the third specific example.

First, as illustrated in FIG. 13A, the rectifying element 20 is formed on the not-illustrated first interconnection 10. The first electrode 30 is formed on the rectifying element 20. The phase-change film 40 containing nitrogen is formed on the first electrode 30. In the process of fabricating the phase-change film 40, nitrogen can be introduced by, as described above, sputtering under a nitrogen atmosphere with a flow rate ratio of nitrogen gas and argon gas ($N_2$/Ar) of 1 to 10%, for example. The second electrode 50 is formed on the phase-change film 40. The not-illustrated second interconnection 60 is formed on the second electrode 50.

Then, as illustrated in FIG. 13B, patterning is performed by etching or the like. The etching is performed to the depth of the interface between the first interconnection 10 and the rectifying element 20.

Then, as illustrated in FIG. 13C, nitrogen and oxygen are introduced through the side face of the phase-change film 40. Nitridation treatment and oxidation treatment on the entire device including the first interconnection 10 and the second interconnection 60, for example, are given as the introduction method. Here, nitrogen and oxygen may be introduced in any sequential order. It is possible to introduce nitrogen first and oxygen next, to introduce oxygen first and nitrogen next, or to introduce both simultaneously.

The nitrogen introduction method described above in regard to the second embodiment may be used as that in this embodiment. On the other hand, the oxidation treatment may be annealing in an atmosphere containing oxygen, oxygen plasma processing, or oxygen radical processing.

Furthermore, this oxidation treatment may be used in combination with oxidation treatment for restoring the rectifying element 20 damaged by the patterning. For example, in the case where an oxide diode such as $CuInO_2$ or $ZnInO_2$ is used as the rectifying element 20, the side wall portion of the rectifying element 20 may be damaged during the patterning process of FIG. 13B. In regard to this, oxidation treatment may be performed to restore the damaged side wall portion of the rectifying element 20. Oxygen may be introduced through the side face of the phase-change film 40 during the oxidation treatment for restoring the rectifying element 20.

By the introduction of nitrogen and oxygen, the nitrogen concentration becomes relatively high and oxygen is introduced on the outer side in a plane of the major surface of the phase-change film 40. Consequently, the low nitrogen concentration portion 42 is formed on the inner side in a plane of the major surface, and the nitrogen/oxygen-introduced portion 46 is formed on the outer side in a plane of the major surface.

FIG. 14A to FIG. 14C and FIG. 15A and FIG. 15B are schematic cross-sectional views in order of the processes illustrating another method for manufacturing a nonvolatile memory device according to the fourth embodiment. That is, these drawings are process cross-sectional views illustrating another example of the method for manufacturing the nonvolatile memory device of the third specific example.

Figure 14A:
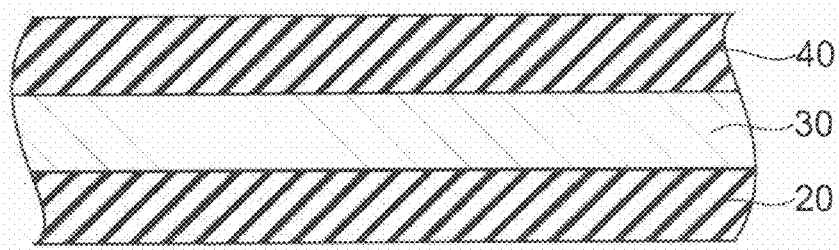
FIG. 14A to FIG. 14C and FIG. 15A and FIG. 15B are schematic cross-sectional views in order of the processes illustrating another method for manufacturing a nonvolatile memory device according to the fourth embodiment.

As illustrated in FIG. 14A, the rectifying element 20 is formed on the not-illustrated first interconnection 10. The first electrode 30 is formed on the rectifying element 20. The phase-change film 40 containing nitrogen is formed on the first electrode 30. As described above, in the process of fabricating the phase-change film 40, nitrogen can be introduced by sputtering under a nitrogen atmosphere with a flow rate ratio of nitrogen gas and argon gas ($N_2$/Ar) of 1 to 10%.

Figure 14B:
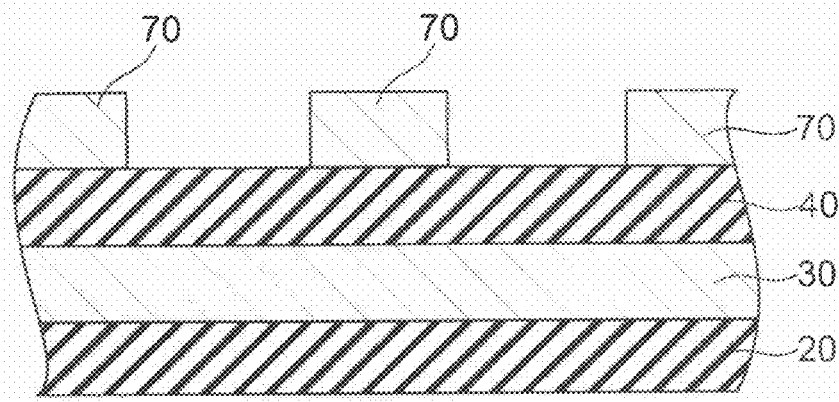

Then, as illustrated in FIG. 14B, the dummy mask 70 is formed on the phase-change film 40.

Figure 14C:
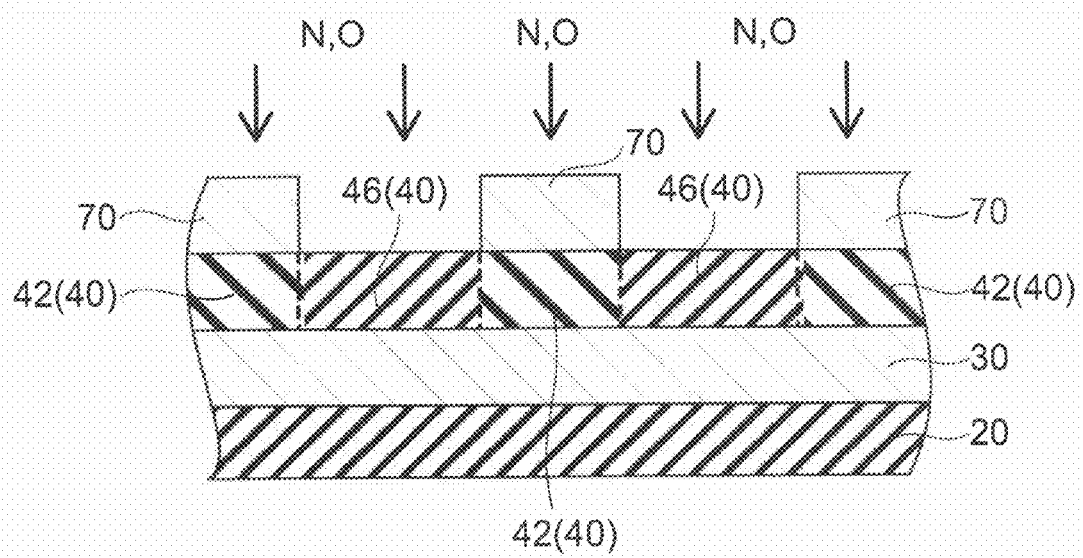

Then, as illustrated in FIG. 14C, nitrogen and oxygen are introduced into the phase-change film 40 by using the dummy mask 70 as a mask. The ion implantation method, the vapor phase diffusion method, a method using plasma or radicals and the like are given as the introduction method. Here, nitrogen and oxygen may be introduced in any sequential order. It is possible to introduce nitrogen first and oxygen next, to introduce oxygen first and nitrogen next, or to introduce both simultaneously. Thereby, the nitrogen/oxygen-introduced portion 46 in which nitrogen is contained at a relatively high concentration and oxygen is introduced and the low nitrogen concentration portion 42 having a relatively low nitrogen concentration are formed in the phase-change film 40.

Figure 15A:
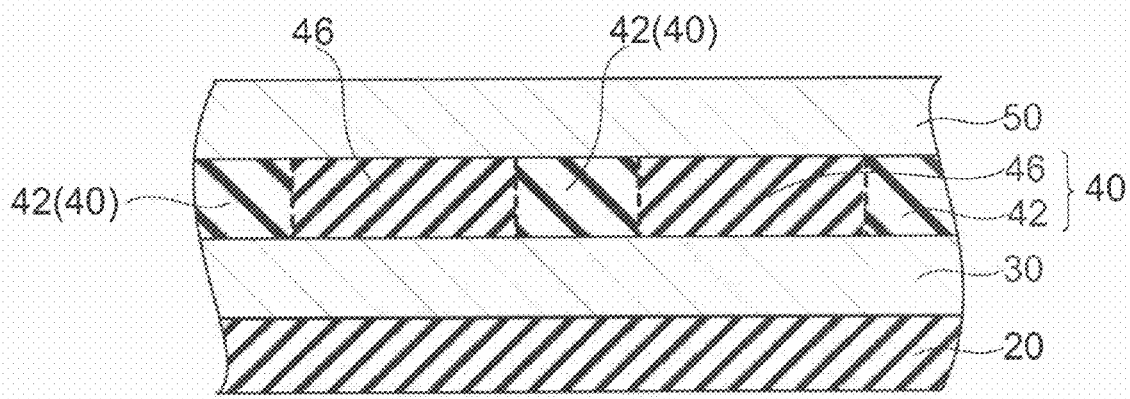

Then, as illustrated in FIG. 15A, the dummy mask 70 is removed. Then, the second electrode 50 is formed on the phase-change film 40. Then, the not-illustrated second interconnection 60 is formed on the second electrode 50.

Figure 15B:
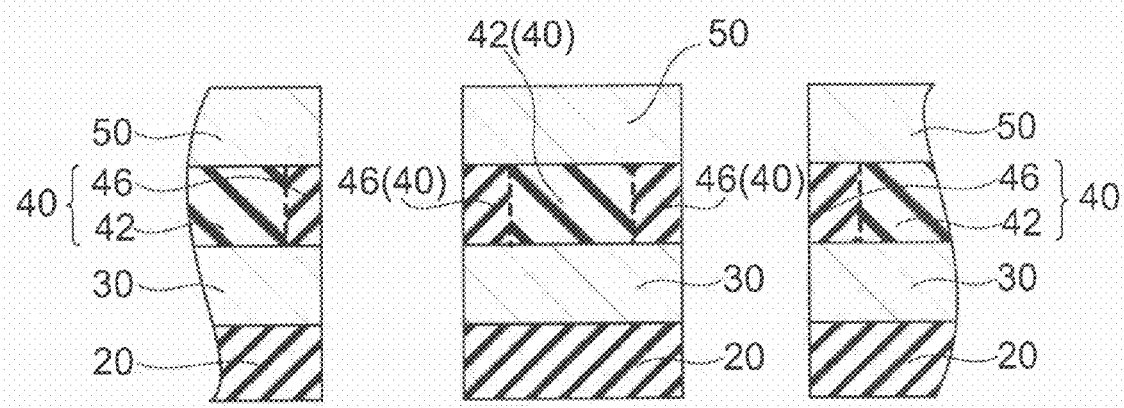

After that, as illustrated in FIG. 15B, patterning is performed by etching or the like through a face immediately above a central portion of the nitrogen/oxygen-introduced portion 46. The etching is performed to the depth of the interface between the first interconnection 10 and the rectifying element 20. Thereby, the nonvolatile memory device of the third specific example is fabricated that includes the low nitrogen concentration portion 42 on the inner side in a plane of the major surface and the (nitrogen and oxygen)-introduced portion 46 on the outer side in a plane of the major surface in the phase-change film 40.

In the processes of FIG. 13A and FIG. 14A in this specific example, the phase-change film 40 containing nitrogen is formed on the first electrode 30. However, the phase-change material film 48 containing no nitrogen may be formed.

Fifth Embodiment

Next, a single-layer or multilayer cross-point nonvolatile memory device that is a fifth embodiment will now be described with reference to FIG. 16 to FIG. 19.

Figure 16:
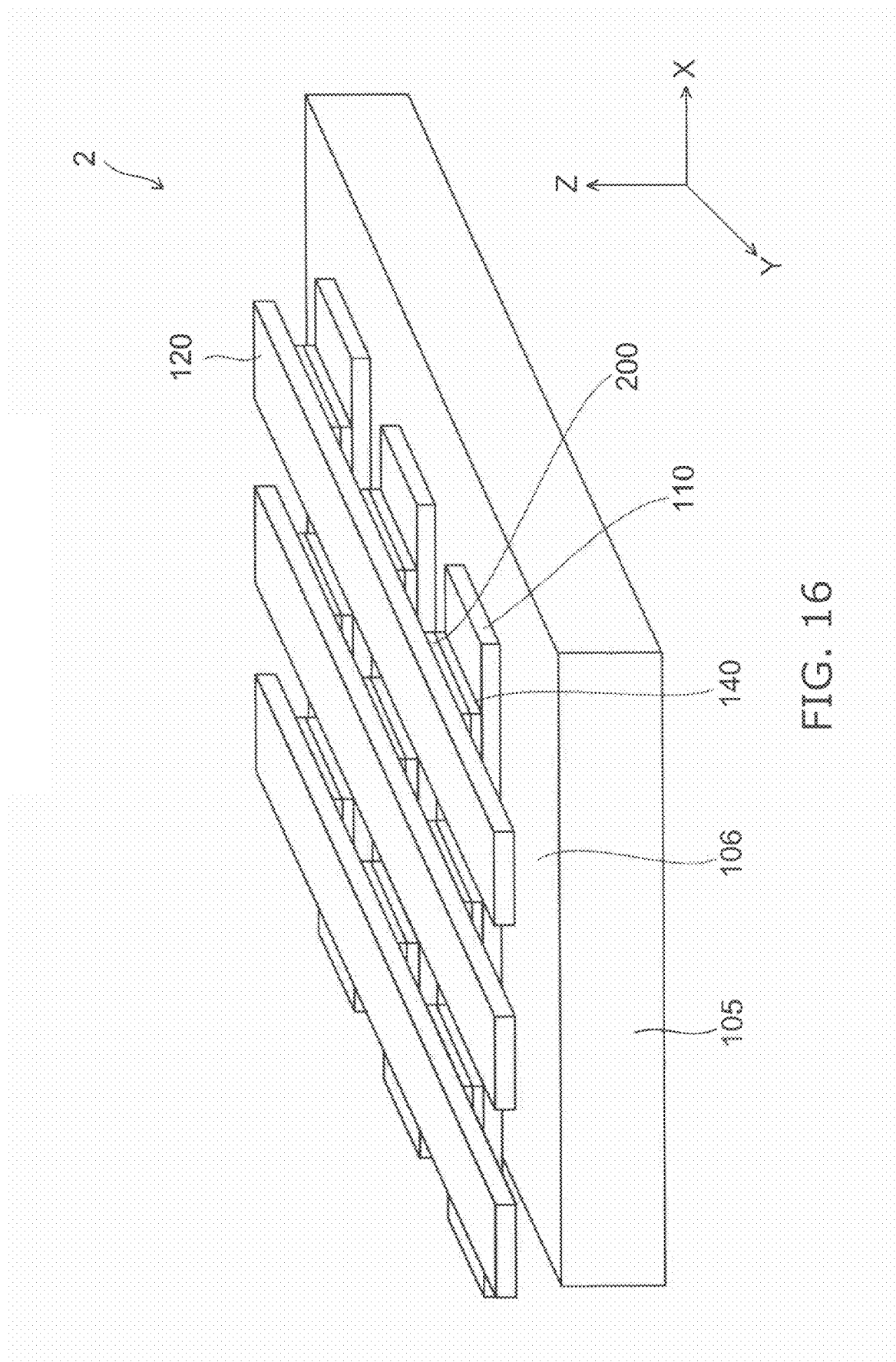
FIG. 16 is a schematic perspective view illustrating the configuration of a nonvolatile memory device according to a fifth embodiment.

FIG. 16 is a schematic perspective view illustrating the configuration of a nonvolatile memory device according to the fifth embodiment. In FIG. 16, inter-element isolation insulating films are omitted.

As illustrated in FIG. 16, in a nonvolatile memory device 2 according to this embodiment, first interconnections 110 having striped shapes extending in an X-axis direction are provided on a major surface 106 of a substrate 105. Second interconnections 120 having striped shapes extending in a Y-axis direction orthogonal to the X-axis in a plane parallel to the substrate 105 are provided opposite to the first interconnections 110.

A memory unit 200 formed of a phase-change film is placed between the first interconnection 110 and the second interconnection 120. That is, in the nonvolatile memory device 2, the memory unit 200 is provided at the intersection (cross-point) of the first interconnection 110 and the second interconnection 120. It is what is called a cross-point cell array structure.

The voltage applied to each memory unit 200 changes in accordance with the combination of the electric potential applied to the first interconnection 110 and the electric potential applied to the second interconnection 120, and information can be stored or erased based on the characteristics, namely the resistance value (the high resistance state of the amorphous state or the low resistance state of the crystal state) at that time, of the memory unit 200.

A rectifying element unit 140 formed of, for example, a diode may be provided in order to provide the voltage applied to the memory unit 200 with a direction of polarity for preventing a sneak current in the recording and reading in the memory unit 200 or the like. In FIG. 16, an example is illustrated in which the rectifying element unit 140 is provided between the first interconnection 110 and the memory unit 200. However, the rectifying element unit 140 may be provided between the second interconnection 120 and the memory unit 200. Furthermore, the rectifying element unit 140 may be provided in a region other than the region where the first interconnection 110 and the second interconnection 120 are opposed.

A not-illustrated electrode may be provided between the rectifying element unit 140 and the memory unit 200 and between the memory unit 200 and the second interconnection 120. This electrode functions also as a protection film.

One memory unit 200 (and one rectifying element unit 140) provided in a region where one first interconnection 110 and one second interconnection 120 intersect is one element and this is referred to as a "cell."

The memory unit 200 formed of a phase-change film may include the low nitrogen concentration portion and the high nitrogen concentration portion in the direction of a plane of the major surface, as described above in regard to the first embodiment. In this case, the nonvolatile memory device according to this embodiment reduces the power consumption and functions as a protection barrier against the penetration of impurities similarly to the first embodiment.

Furthermore, the memory unit 200 formed of a phase-change film may include the low nitrogen concentration portion and the nitrogen/oxygen-introduced portion in the direction of the major surface, as described above in regard to the third embodiment. Also in this case, the nonvolatile memory device according to this embodiment reduces the power consumption and functions as a protection barrier against the penetration of impurities.

Although FIG. 16 illustrates an example in which three first interconnections 110 and three second interconnections 120 are provided, the numbers of first interconnections 110 and second interconnections 120 are not limited thereto but optional.

The first interconnection 110 is referred to as a bit line (BL) and the second interconnection 120 is referred to as a word line (WL). However, it is possible to take the first interconnection 110 as the word line (WL) and the second interconnection 120 as the bit line (BL).

Figure 17:
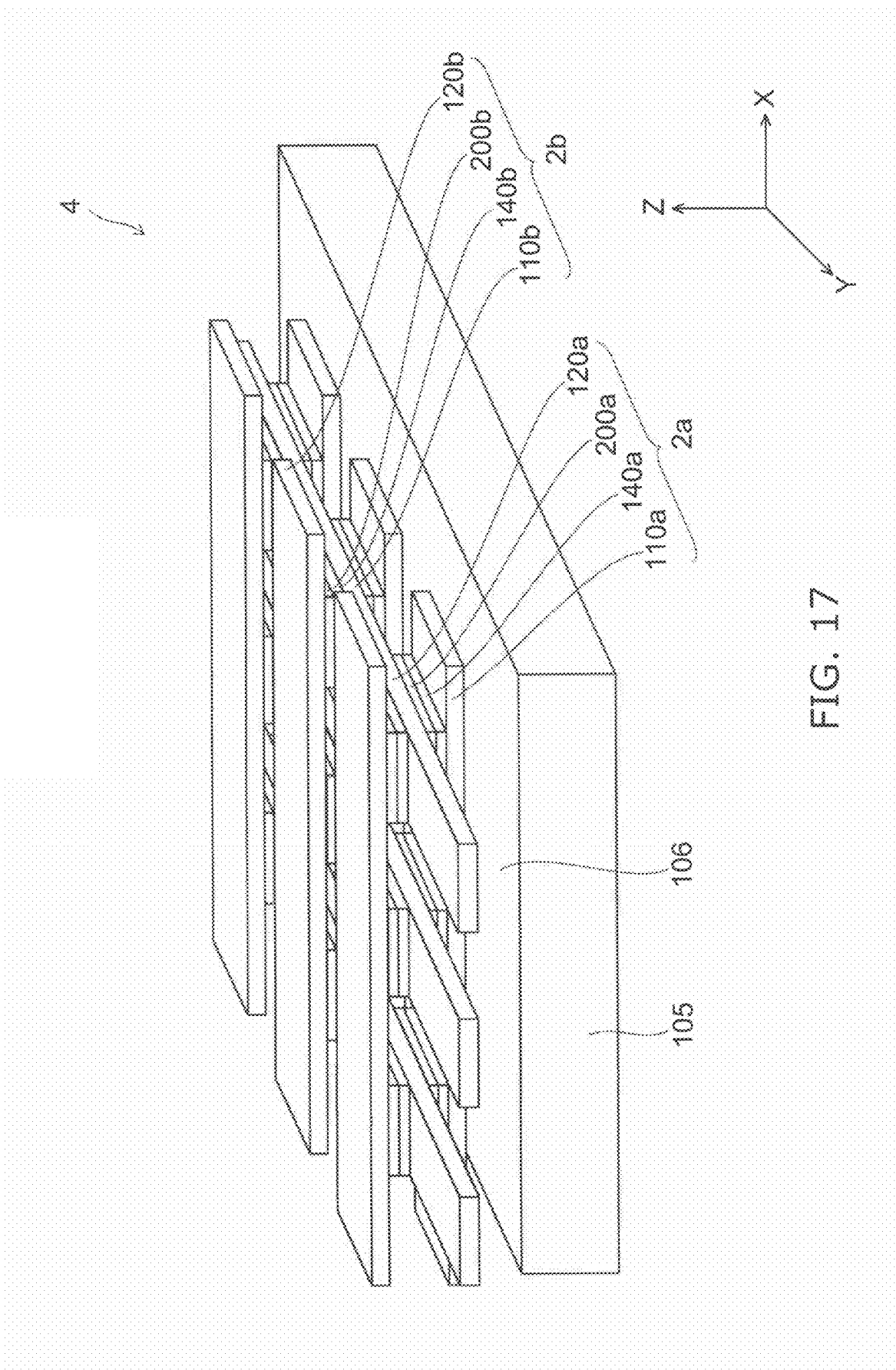
FIG. 17 is a schematic perspective view illustrating the configuration of another nonvolatile memory device according to the fifth embodiment.

FIG. 17 is a schematic perspective view illustrating the configuration of another nonvolatile memory device according to the fifth embodiment.

As illustrated in FIG. 17, in a nonvolatile memory device 4 according to this embodiment, the memory unit 200 is configured in two layers. That is, the nonvolatile memory device 4 includes: the substrate 105; first interconnections 110a provided as the first layer on the major surface 106 of the substrate 105; the second interconnections 120a provided as the first layer opposite to the first interconnections 110a; and a memory unit 200a placed as the first layer between the first interconnection 110a as the first layer and the second interconnection 120a as the first layer. These form a nonvolatile memory device 2a as the first layer. Furthermore, the second interconnection 120a as the first layer is taken as a first interconnection 110b as the second layer, a memory unit 200b is provided as the second layer thereon, and a second interconnection 120b is provided as the second layer thereon. These form a nonvolatile memory device 2b as the second layer. Furthermore, switch element units 140a and 140b are provided in the respective layers.

The memory unit 200 formed of each phase-change film may include the low nitrogen concentration portion and the high nitrogen concentration portion, or the low nitrogen concentration portion and the nitrogen/oxygen-introduced portion. In this case, the characteristics described above in regard to FIG. 16 are obtained.

Figure 18:
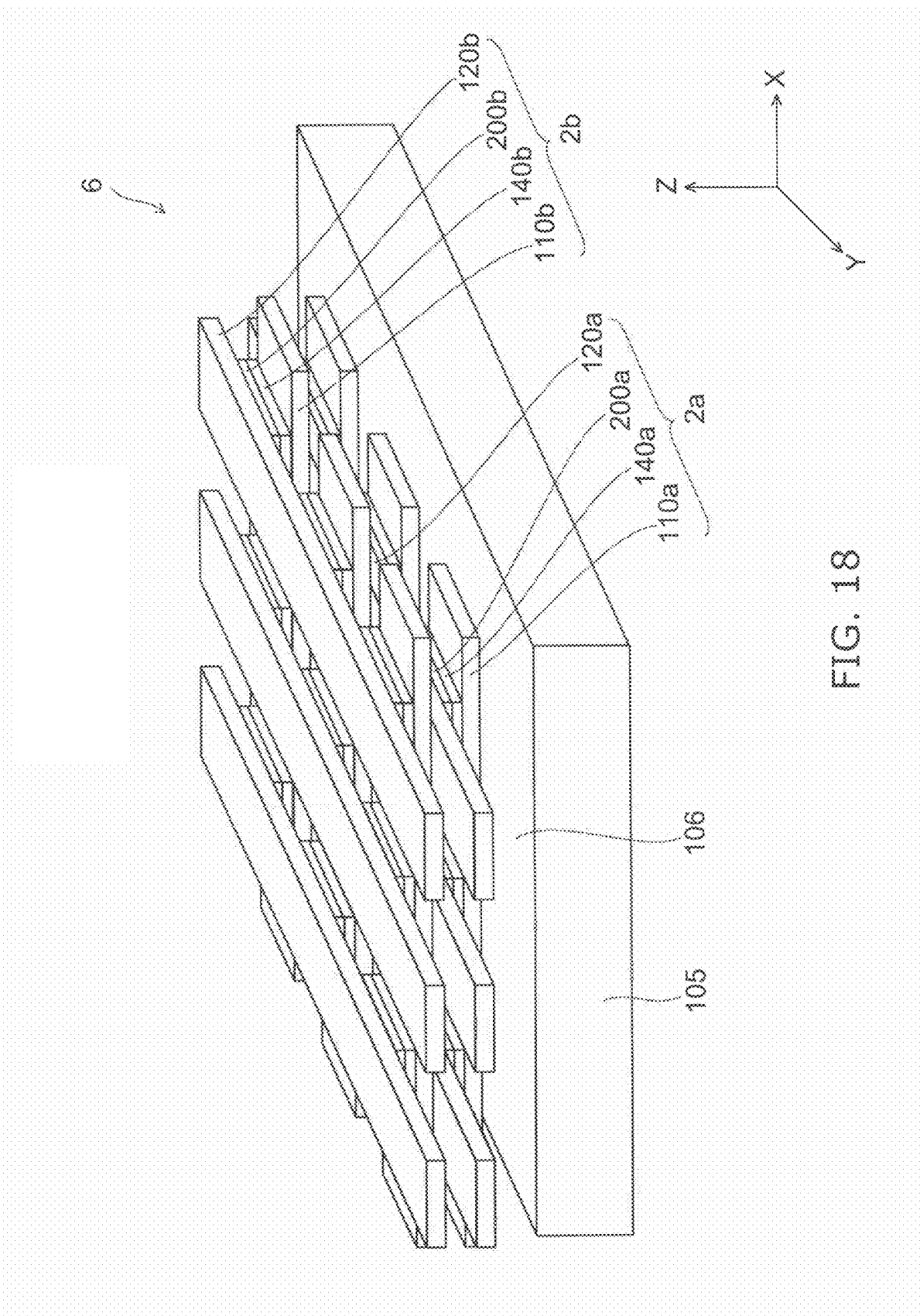
FIG. 18 is a schematic perspective view illustrating the configuration of another nonvolatile memory device according to the fifth embodiment.

FIG. 18 is a schematic perspective view illustrating the configuration of another nonvolatile memory device according to the fifth embodiment.

As illustrated in FIG. 18, in another nonvolatile memory device 6 according to this embodiment, the second interconnection 120a as the first layer and the first interconnection 110b as the second layer are provided individually. Also in this case, the memory unit 200 formed of each phase-change film may include the low nitrogen concentration portion and the high nitrogen concentration portion, or the low nitrogen concentration portion and the nitrogen/oxygen-introduced portion. Also in this case, the characteristics described above in regard to FIG. 16 are obtained.

Although FIG. 17 and FIG. 18 illustrate the case where the memory unit 200 is stacked in two layers, the memory unit 200 may be stacked in three or more layers.

Next, the record, erase, and read operations of the nonvolatile memory device according to the fifth embodiment of the invention will now be described with reference to FIG. 16.

Data of one bit, for example, are stored in one memory unit 200.

The initial state (the state in which no information is stored) of the memory unit 200 may be any of the crystalline state (low resistance state) and the amorphous state (high resistance state). Hereinbelow, the case is taken up in which the initial state of the memory unit 200 is the amorphous state (high resistance state).

The recording (writing) of information in the memory unit 200 is performed by applying a voltage to the memory unit 200 to pass a current pulse. To this end, a state is created in which, for example, the electric potential of the first interconnection 110 is relatively lower than the electric potential of the second interconnection 120. Assuming that the second interconnection 120 is set at, for example, the ground potential, a negative electric potential may be applied to the first interconnection 110. At this time, the current pulse flows preferentially through the low nitrogen concentration portion 42 described above.

The Joule heat generated at this time heats the low nitrogen concentration portion 42 of the memory unit 200 to the crystallization temperature or higher. This temperature is kept for a certain period of time, for example, a time shorter than one microsecond. Then, the memory unit 200 is cooled slowly to be phase-changed into the crystalline state. Thereby, information is written. At this time, the high nitrogen concentration portion 44 adjacent to the low nitrogen concentration portion 42 is not crystallized and can maintain the amorphous state, because the high nitrogen concentration portion 44 passes almost no current therethrough and has a high crystallization temperature.

Here, preferably no electric potential gradient is generated between the first interconnection 110 and the second interconnection 120 related to a not-selected cell. That is, both are preferably at the same electric potential.

Furthermore, all the first interconnections 110 and all the second interconnections 120 are preferably precharged just immediately before the recording (writing) (at the time of a standby state). The "precharge" refers to keeping the electric potentials of the interconnections constant in advance in order to ensure good operating characteristics.

The voltage pulse for the recording may be generated by making the electric potential of the first interconnection 110 higher than the electric potential of the second interconnection 120.

The erasing (reset) is performed by the Joule heat generated by passing a large current pulse through the memory unit 200. Also at this time, the current pulse flows preferentially through the low nitrogen concentration portion 42. This Joule heat heats the low nitrogen concentration portion 42 of the memory unit 200 to the melting point (in the case of $Ge_2Sb_2Te_5$, the melting point is 633° C.) or higher. Then, the memory unit 200 is cooled rapidly in a period of time shorter than, for example, 100 nanoseconds to phase-change the low nitrogen concentration portion 42 into the amorphous state. Thereby, information is erased. At this time, since the high nitrogen concentration portion 44 adjacent to the low nitrogen concentration portion 42 hardly passes a current therethrough and has a high crystallization temperature, the high nitrogen concentration portion 44 can be prevented from being melted and crystallized in the case where the low nitrogen concentration portion 42 is heated and then cooled rapidly.

The reading (reading-out) is performed by applying a voltage to the memory unit 200 to pass a current pulse and detecting the resistance value at this time. However, amplitude of the voltage pulse is taken to be enough small not to generate a phase change in the material of the memory unit 200. At this time, the resistance value of the memory unit 200 can be measured by, for example, using a reading-out circuit. The reading-out current generated from the reading-out circuit flows through the second interconnection 120 into the memory unit 200, and the resistance value of the memory unit 200 is measured by the reading-out circuit. The low nitrogen concentration portion 42 is transformed between the crystalline state and the amorphous state in accordance with the writing/erasing, and on the other hand the high nitrogen concentration portion 44 is kept constantly in the amorphous state. Therefore, information can be read by detecting a change in the resistance of the low nitrogen concentration portion 42.

Furthermore, also in the reading, a situation can be brought about in which a current pulse flows preferentially through the low nitrogen concentration portion 42 and hardly through the high nitrogen concentration portion 44. Consequently, power consumption can be reduced.

Such a nonvolatile memory device can achieve a higher recording density and lower power consumption than currently-used hard disks and conventional nonvolatile memory devices using transistor.

Figure 19:
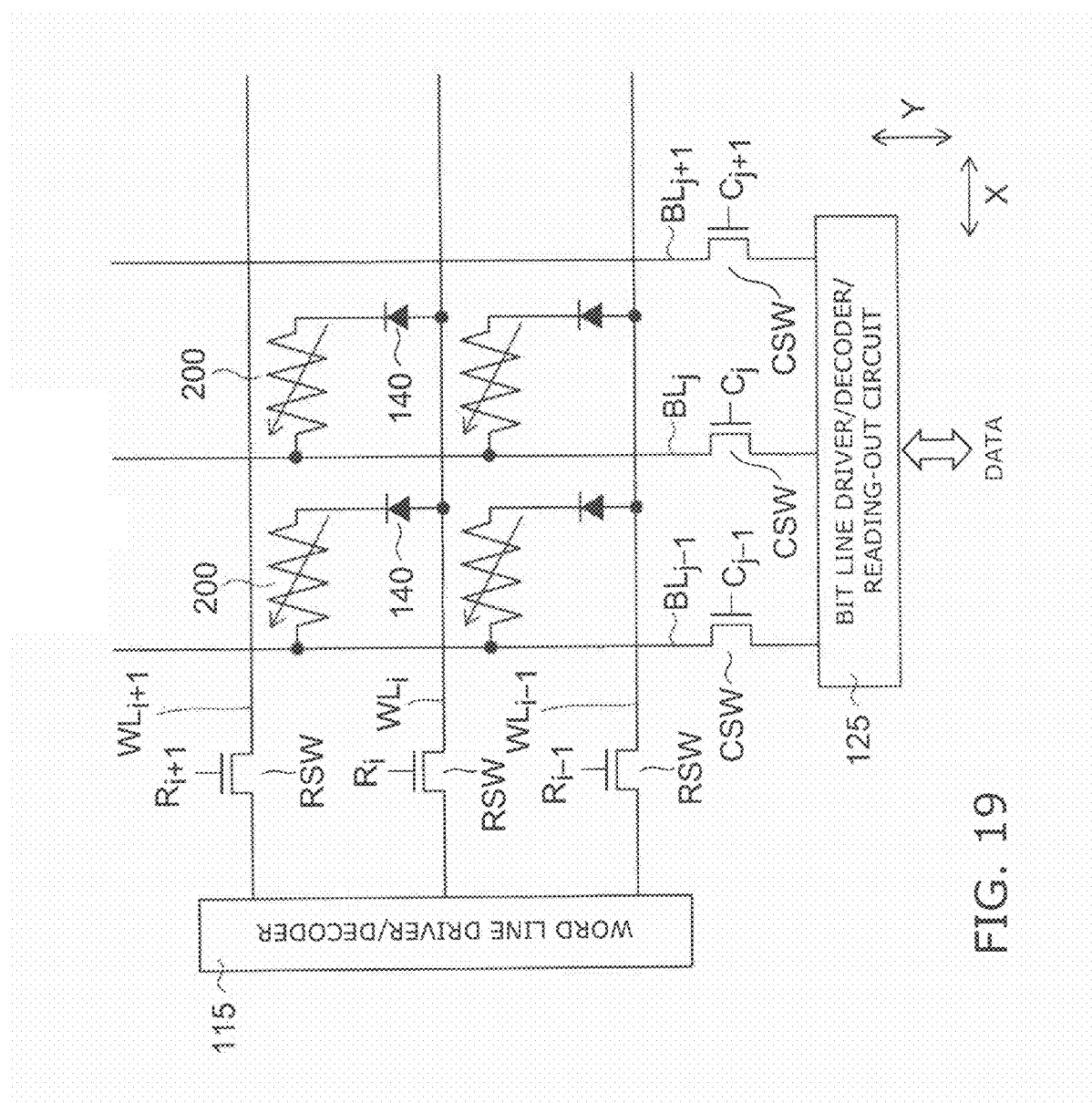
FIG. 19 is a circuit diagram illustrating the configuration of the nonvolatile memory device according to the fifth embodiment.

FIG. 19 is a circuit diagram illustrating the configuration of the nonvolatile memory device according to the fifth embodiment.

That is, the drawing is a schematic diagram illustrating the circuit of the nonvolatile memory device illustrated in FIG. 16. "BL" represents the bit line, and "WL" represents the word line.

Word lines $WL_{i-1}$, $WL_i$, and $WL_{i+1}$ extend in the X direction and bit lines $BL_{j-1}$, $BL_j$, and $BL_{j+1}$ extend in the Y direction. One ends of the word lines $WL_{i-1}$, $WL_i$, and $WL_{i+1}$ are connected to a word line driver/decoder 115 via MOS transistors RSW (row switch) as selection switches, and one ends of the bit lines $BL_{j-1}$, $BL_j$, and $BL_{j+1}$ are connected to a bit line driver/decoder/reading-out circuit 125 via MOS transistors CSW (column switch) as selection switches.

Selection signals $R_{i-1}$, $R_i$, and $R_{i+1}$ for selecting one word line (row) are inputted to the gates of the MOS transistors RSW, and selection signals $C_{j-1}$, $C_j$, and $C_{j+1}$ for selecting one bit line (column) are inputted to the gates of the MOS transistors CSW.

The memory unit 200 is disposed at the intersections of the word lines $WL_{i-1}$, $WL_i$, and $WL_{i+1}$ and the bit lines $BL_{j-1}$, $BL_j$, and $BL_{j+1}$.

The rectifying element unit 140 is added to the memory unit 200.

Thus, the cross-point nonvolatile memory device of this specific example is advantageous for high integration because it is not necessary to connect a MOS transistor individually to the memory unit of each cell and it is possible to stack multiple layers.

As described above, the embodiments provide a nonvolatile memory device that: includes a phase-change film containing a material that changes between the crystal state and the amorphous state by applying a voltage and; can reduce power consumption, and a method for manufacturing the same.

Hereinabove, embodiments of the invention are described with reference to specific examples. However, the embodiments of the invention are not limited to these specific examples. That is, one skilled in the art may perform appropriately design modifications on these specific examples. Such modifications also are included in the scope of the invention to the extent that the purport of the invention is included. For example, components of the specific examples described above and the arrangement, material, conditions, shape, size, and the like thereof are not limited to those illustrated but may be appropriately altered.

Furthermore, components of the embodiments described above may be combined within the extent of technical feasibility; and combinations of them also are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile memory device comprising:
    a stacked body including
        a first layer;
        a second layer; and
        a recording layer provided between the first layer and the second layer, the recording layer being capable of reversibly changing between a first state and a second state having a resistance higher than a resistance in the first state by a current supplied via the first layer and the second layer,
    the recording layer including a first portion and a second portion provided in a plane of a major surface of the recording layer, the second portion having a nitrogen amount higher than a nitrogen amount in the first portion.

2. The device according to claim 1, wherein the first portion surrounds the second portion in the plane of the major surface.

3. The device according to claim 1, wherein the second portion surrounds the first portion in the plane of the major surface.

4. The device according to claim 3, wherein the second portion contains oxygen of a concentration of oxygen higher than a concentration of oxygen in the first portion.

5. The device according to claim 1, wherein the first portion is in a crystal state in the first state and the first portion is in an amorphous state in the second state.

6. The device according to claim 1, wherein the second portion is in an amorphous state in the first state and the second state.

7. The device according to claim 1, wherein the recording layer contains a compound containing a group 16 element.

8. The device according to claim 7, wherein the group 16 element is at least one of selenium and tellurium.

9. The device according to claim 7, wherein the compound containing the group 16 element is at least one selected from the group consisting of $Ge_2Sb_2Te_5$, GeSbTe, SbTe, AsSbTe, SeSbTe and AgInSbTe.

10. The device according to claim 1, further comprising:
    a first interconnection extending along a first direction; and
    a second interconnection extending along a second direction intersecting with the first direction,
    the stacked body being connected to the first interconnection and the second interconnection at an intersection of the first interconnection and the second interconnection, the current being supplied to the stacked body via the first interconnection and the second interconnection.

11. The device according to claim 10, further comprising a rectifying element provided at least one of between the first interconnection and the stacked body and between the second interconnection and the stacked body.

12. The device according to claim 1, wherein at least one of the first layer and the second layer contains at least one of
    MN ("M" is at least one element selected from the group consisting of Ti, Zr, Hf, V, Nb, and Ta. "N" is nitrogen.),
    $MO_x$ ("M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt, "x" satisfies $1 \leq x \leq 4$. "O" is oxygen.),
    $AMO_3$ ("A" is at least one element selected from the group consisting of La, K, Ca, Sr, Ba, and Ln (lanthanoids). "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt, "O" is oxygen.), and $A_2MO_4$ ("A" is at least one element selected from the group consisting of K, Ca, Sr, Ba, and Ln (lanthanoids). "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. "O" is oxygen.).

* * * * *